US009659754B2

(12) United States Patent
Yoshikawa et al.

(10) Patent No.: US 9,659,754 B2
(45) Date of Patent: May 23, 2017

(54) PLASMA PROCESSING APPARATUS AND PLASMA PROCESSING METHOD

(71) Applicant: TOKYO ELECTRON LIMITED, Tokyo (JP)

(72) Inventors: Jun Yoshikawa, Miyagi (JP); Yoshio Susa, Miyagi (JP); Naoki Matsumoto, Miyagi (JP); Peter L. G. Ventzek, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/071,717

(22) Filed: Nov. 5, 2013

(65) Prior Publication Data

US 2014/0124478 A1 May 8, 2014

(30) Foreign Application Priority Data

Nov. 6, 2012 (JP) .................................. 2012-244348
Aug. 2, 2013 (JP) .................................. 2013-161875

(51) Int. Cl.
*C23C 16/00* (2006.01)
*C23F 1/00* (2006.01)
*H01L 21/306* (2006.01)
*H01J 37/32* (2006.01)

(52) U.S. Cl.
CPC .... *H01J 37/3266* (2013.01); *H01J 37/32669* (2013.01); *H01J 37/32678* (2013.01)

(58) Field of Classification Search
USPC .............. 156/345.42; 118/723 MR, 723 MA, 118/723 AN; 315/111.41
See application file for complete search history.

(56) References Cited

U.S. PATENT DOCUMENTS

| | | | | |
|---|---|---|---|---|
| 4,996,077 A | * | 2/1991 | Moslehi et al. | 427/562 |
| 5,181,986 A | * | 1/1993 | Ohiwa | 438/728 |
| 5,234,526 A | * | 8/1993 | Chen | H01J 37/32238 118/252 |
| 5,304,277 A | * | 4/1994 | Ohara et al. | 156/345.42 |
| 5,342,472 A | * | 8/1994 | Imahashi | H01J 37/32192 118/723 R |
| 5,587,205 A | * | 12/1996 | Saito et al. | 427/553 |
| 5,824,602 A | * | 10/1998 | Molvik et al. | 438/714 |
| 6,085,688 A | * | 7/2000 | Lymberopoulos et al. | 118/723 I |

(Continued)

FOREIGN PATENT DOCUMENTS

WO   2008/108213 A1   9/2008

*Primary Examiner* — Rakesh Dhingra
(74) *Attorney, Agent, or Firm* — Rothwell, Figg, Ernst & Manbeck, P.C.

(57) ABSTRACT

The present disclosure provides a plasma processing apparatus, including: a processing chamber; an oscillator configured to output high-frequency power; a power supply unit configured to supply the high-frequency power from a specific plasma generating location into the processing chamber; a magnetic field forming unit provided outside the processing chamber and configured to forming a magnetic field at least at the specific plasma generating location; and a control unit configured to control the magnetic field formed by the magnetic field forming unit such that a relationship between an electron collision frequency fe of plasma generated in the processing chamber and a cyclotron frequency fc is fc>fe.

11 Claims, 21 Drawing Sheets

(56) References Cited

U.S. PATENT DOCUMENTS

| | | | |
|---|---|---|---|
| 6,245,190 B1* | 6/2001 | Masuda | H01J 37/32082 118/723 MA |
| 8,262,844 B2* | 9/2012 | Ishikawa | C23C 16/511 156/345.1 |
| 8,343,308 B2* | 1/2013 | Tian | C23C 16/511 118/723 MA |
| 2003/0010453 A1* | 1/2003 | Tanaka et al. | 156/345.38 |
| 2003/0150846 A1* | 8/2003 | Ishii et al. | 219/121.43 |
| 2007/0113788 A1* | 5/2007 | Nozawa et al. | 118/723 MW |
| 2008/0121345 A1* | 5/2008 | Shannon et al. | 156/345.46 |
| 2008/0245969 A1* | 10/2008 | Descamps et al. | 250/423 R |
| 2010/0089871 A1* | 4/2010 | Ishikawa | C23C 16/511 216/70 |
| 2012/0103939 A1* | 5/2012 | Wu | H01J 37/32192 216/70 |

\* cited by examiner

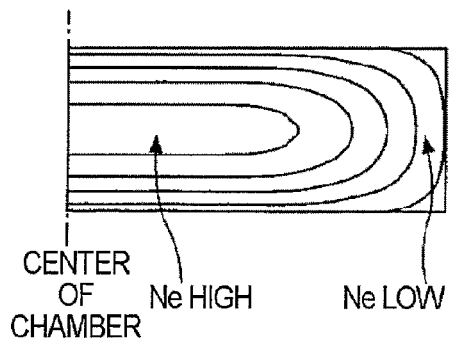
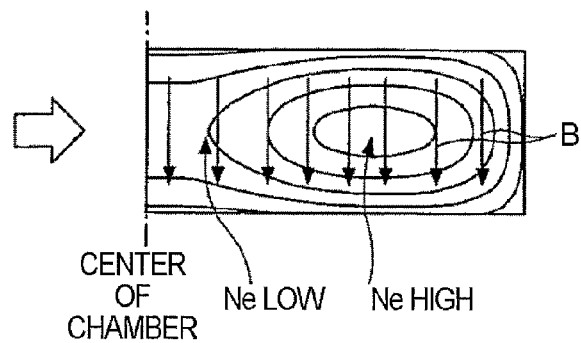
FIG.4A / FIG.4B
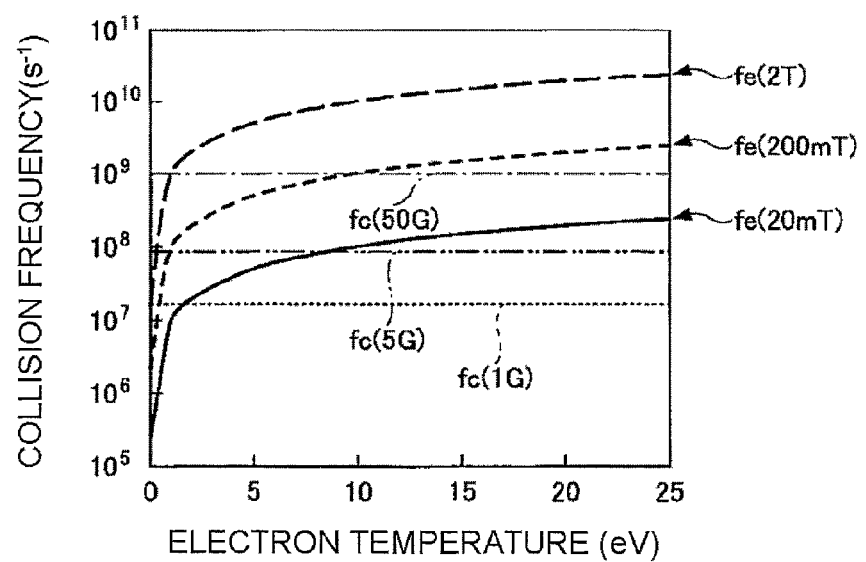
FIG.5

CENTER OF CHAMBER

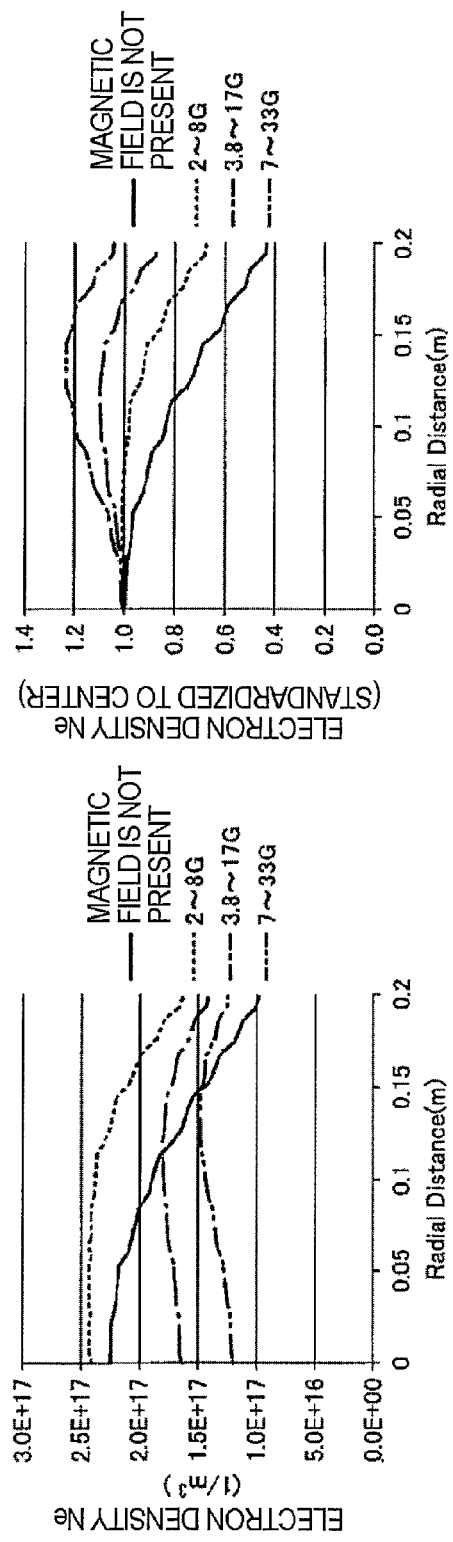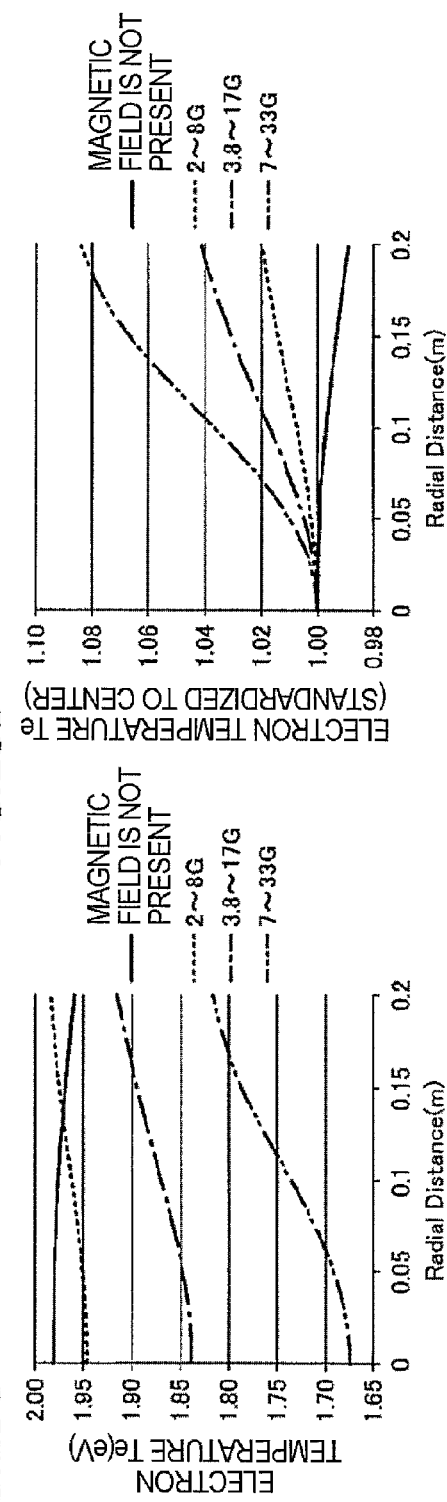

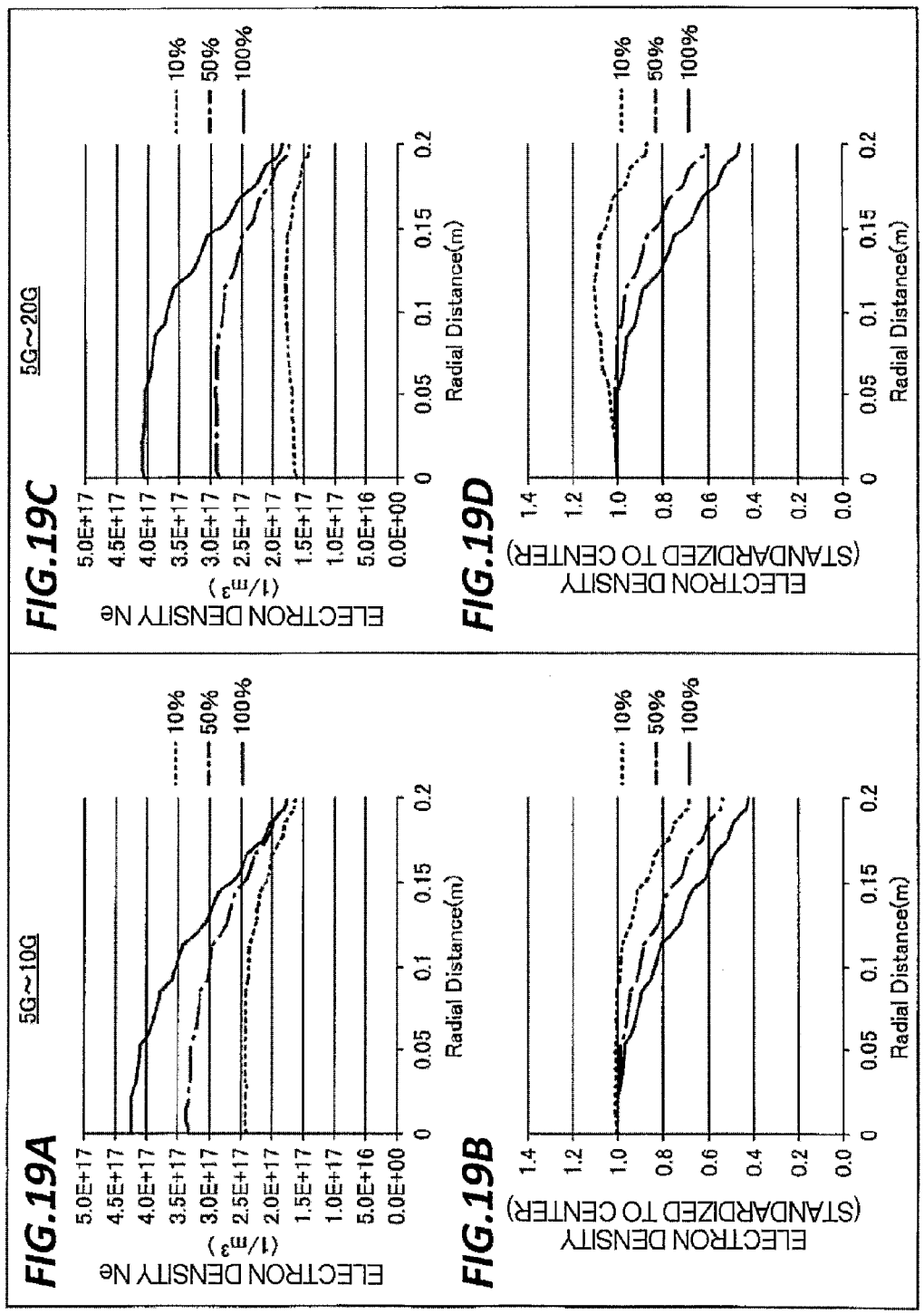

PLASMA PROCESSING APPARATUS AND PLASMA PROCESSING METHOD

CROSS-REFERENCE TO RELATED APPLICATIONS

This application is based on and claims priority from Japanese Patent Application Nos. 2012-244348 and 2013-161875, filed on Nov. 6, 2012 and Aug. 2, 2013, respectively, with the Japan Patent Office, the disclosures of which are incorporated herein in their entireties by reference.

TECHNICAL FIELD

The present disclosure relates to a plasma processing apparatus and a plasma processing method.

BACKGROUND

A plasma processing apparatus such as a radial line slot antenna apparatus, or the like generates plasma and performs minute processing on a processed body such as a wafer or a substrate by the action of the plasma, thereby manufacturing a semiconductor device. In the plasma processing apparatus, it is important to uniformly generate plasma. In particular, in recent years, minuteness has been in progress due to a request for high integration and rapidness of an LSI. Further, the processed body is enlarged. Under the circumstances, uniformity of plasma becomes more important in order to successfully microfabricate the processed body.

Therefore, a radial line slot antenna apparatus is proposed, which has a mechanism for suppressing damage of an element by improving electron density or uniformity of plasma (see, for example, International Publication No. WO2008/108213). According to International Publication No. WO2008/108213, a magnetic field forming portion is formed at an upper side of an antenna for introducing a microwave, which is provided in the radial line slot antenna apparatus, and a plasma feature of gas generated in a processing container by the microwave is controlled by a magnetic field formed by the magnetic field forming portion.

SUMMARY

The present disclosure provides a plasma processing apparatus including: a processing chamber; an oscillator configured to output high-frequency power; a power supply unit configured to supply the high-frequency power from a specific plasma generating location into the processing chamber; a magnetic field forming unit provided outside the processing chamber and configured to form a magnetic field at least at the specific plasma generating location; and a control unit configured to control the magnetic field formed by the magnetic field forming unit such that a relationship between an electron collision frequency fe of plasma generated in the processing chamber and a cyclotron frequency fc is fc>fe.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A-4B are diagrams illustrating a magnetic field and an electron density distribution of plasma according to the first exemplary embodiment.

FIG. 5 is a diagram illustrating an electron collision frequency of plasma and a cyclotron frequency according to the first exemplary embodiment and a second exemplary embodiment.

FIGS. 15A-15D are diagrams illustrating the electron density and the electron temperature in the second exemplary embodiment.

FIGS. 19A-19D are diagrams illustrating the electron density depending on the power output ratio from the plasma generating location in the second exemplary embodiment (the magnetic field is present).

DETAILED DESCRIPTION

Figure 1:
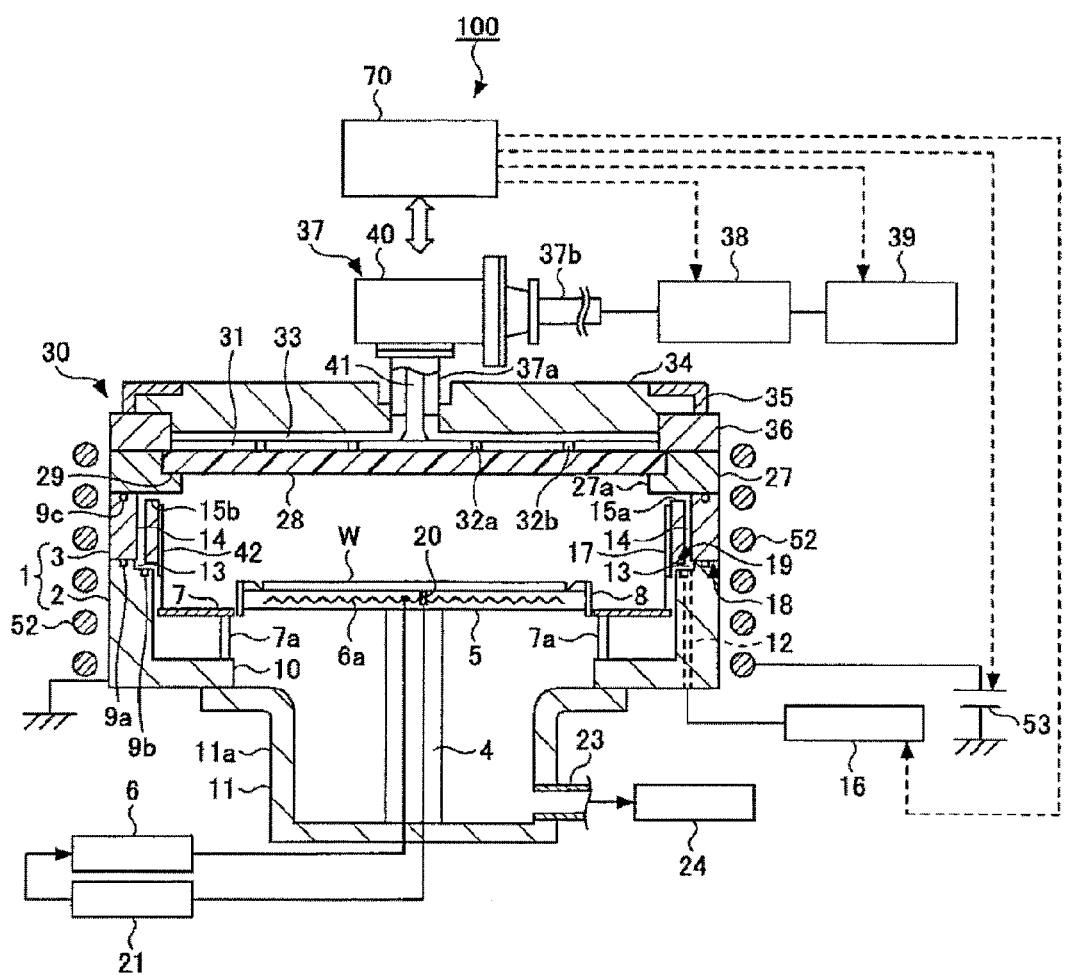
FIG. 1 is a longitudinal cross-sectional view of a radial line slot antenna apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In International Publication No. WO2008/108213, since the location of a slot or an applied magnetic field is not optimized, a problem that uniformity of plasma is inclined in a radius direction of an object to be processed is not solved.

In particular, under a low-pressure condition of 50 mTorr (6.66 Pa) or less, electron density of plasma at the center side of a plasma processing apparatus tends to be higher than the electron density of plasma at an outer peripheral side thereof and it is more difficult to control plasma by an inclination of the electron density of plasma toward the center side.

In order to solve the problem, the present disclosure provides a plasma processing apparatus and a plasma processing method that can improve controllability of a plasma distribution by optimizing an applied magnetic field.

In order to solve the problem, a plasma processing apparatus according to an exemplary embodiment of the present disclosure includes: a processing chamber; an oscillator configured to output high-frequency power; a power supply unit configured to supply the high-frequency power from a specific plasma generating location into the processing chamber; a magnetic field forming unit provided outside the processing chamber and configured to form a magnetic field at least at the specific plasma generating location; and a control unit configured to control the magnetic field formed by the magnetic field forming unit such that a relationship between an electron collision frequency fe of plasma generated in the processing chamber and a cyclotron frequency fc is fc>fe.

In the above-mentioned plasma processing apparatus, the magnetic field forming unit forms a magnetic field including a perpendicular magnetic field at the specific plasma generating location. Further, the magnetic field forming unit is provided on an outer peripheral portion or a lateral portion of an antenna unit provided at a ceiling of the processing chamber.

In the above-mentioned plasma processing apparatus, the specific plasma generating location is provided at a location of 50% or more spaced from a center location of the processing chamber with respect to a diameter of the processing chamber in the antenna unit provided in the ceiling of the processing chamber. Further, the specific plasma generating location is formed outside the peripheral portion of an object to be processed that is placed in the processing chamber. Furthermore, the specific plasma generating location is at least one of a location of a slot hole formed in the antenna unit and a location along a concave portion.

In the above-mentioned plasma processing apparatus, a gap between the ceiling of the processing chamber and the placed object to be processed is set such that the magnetic field formed by the magnetic field forming unit does not reach the placed object to be processed.

In the above-mentioned plasma processing apparatus, the control unit controls a pressure in the processing chamber to be 50 mTorr (6.66 Pa) or less.

Further, a plasma processing apparatus according to another exemplary embodiment of the present disclosure includes: a processing chamber into which gas is introduced to generate plasma; a magnetic field forming unit provided outside the processing chamber and configured to form a magnetic field in a direction perpendicular to an object to be processed that is placed in the processing chamber; an oscillator configured to output high-frequency power; an antenna unit provided in the processing chamber and configured to supply the high-frequency power output by the oscillator to the processing chamber; and a control unit configured to control the magnetic field formed by the magnetic field forming unit such that a relationship between an electron collision frequency fe of plasma generated in the processing chamber and a cyclotron frequency fc is fc>fe.

In the above-mentioned plasma processing apparatus, the antenna unit has a plurality of slot holes and introduces a microwave propagated into a waveguide through the plurality of slot holes into the processing chamber, and the plurality of slot holes is placed at a location of 50% or more spaced from a center location of the processing chamber with respect to a radius of the processing chamber. Further, the plurality of slot holes is placed outside the peripheral portion of the placed object to be processed.

In the above-mentioned plasma processing apparatus, the control unit controls the intensity of the magnetic field formed by the magnetic field forming unit to be 1 G to 50 G ($10^{-4}$ T to $50^{-3}$ T).

In the above-mentioned plasma processing apparatus, the gas introduced into the processing chamber is argon gas, and the control unit controls an electron temperature of plasma generated in the processing chamber to be 0.5 eV to 5 eV.

In the above-mentioned plasma processing apparatus, the control unit controls a pressure in the processing chamber to be 20 mT to 200 mT (2.67 Pa to 26.7 Pa). Further, the control unit switches ON and OFF of application of the magnetic field in time division, and pulse-controls the magnetic field.

Further, a plasma processing method according to yet another exemplary embodiment of the present disclosure includes: supplying high-frequency power from a specific plasma generating location into a processing chamber; forming a magnetic field at least at the specific plasma generating location, which is provided outside the processing chamber; and controlling the magnetic field such that a relationship between an electron collision frequency fe of plasma generated in the processing chamber and a cyclotron frequency fc is fc>fe.

In the above-mentioned plasma processing method, the controlling of the magnetic field includes switching ON and OFF of application of the magnetic field in time division and pulse-controlling the magnetic field.

In the above-mentioned plasma processing method, the specific plasma generating location is around just below a transmission plate serving as a dielectric window passing the high-frequency power and electron density of plasma just below the transmission plate is higher than frequency cutoff density of the high-frequency power.

According to exemplary embodiments of the present disclosure, controllability of a plasma distribution may be improved by appropriating an applied magnetic field.

Hereinafter, exemplary embodiments of the present disclosure will be described with reference to the accompanying drawings. Further, in the specification and drawings, like reference numerals refer to substantially like elements, and as a result, a duplicated description will be omitted.

First Exemplary Embodiment

Overall Configuration of Radial Line Slot Antenna Apparatus

First, an overall configuration of a radial line slot antenna apparatus according to a first exemplary embodiment of the present disclosure will be described with reference to FIG. 1. FIG. 1 is a longitudinal cross-sectional view of a radial line slot antenna apparatus according to the first exemplary embodiment of the present disclosure. In a radial line slot antenna apparatus 100, a microwave is introduced into a processing chamber through a plane type antenna having a plurality of slots, for example, a radial line slot antenna. In the radial line slot antenna apparatus 100, plasma excited by the microwave is surface wave plasma (SWP) excited by a surface wave propagated on an interface of a dielectric just below the antenna and plasma. The surface wave plasma has high electron density of plasma throughout a wide area just below the antenna. As a result, it is possible to perform uniform plasma processing within a short time. Further, since the surface wave plasma is at a low electron temperature, damage to an element may be decreased.

The radial line slot antenna apparatus 100 has a substantially cylindrical grounded chamber (processing chamber) 1. A wafer W is carried into the chamber 1 in an airtight state. The chamber 1 includes a housing 2 and a cylindrical chamber wall 3 placed thereabove. The housing 2 and the chamber wall 3 are made of a metallic material such as aluminum or stainless steel. Further, a microwave introduction unit 30 for introducing the microwave into a processing space is provided above the chamber 1 to be openable and closable.

An exhaust chamber 11 is provided below the housing 2 to communicate with an opening portion 10 formed at the center of a bottom plate of the housing 2. An inner part of the chamber 1 is evenly exhausted by the exhaust chamber 11.

A susceptor 5 that horizontally supports the wafer W which is a target of the plasma processing is provided in the housing 2. In detail, the susceptor 5 is supported by a cylindrical support member 4 that is extended upwardly from the center of a bottom of the exhaust chamber 11. The susceptor 5 and the support member 4 may be made of a ceramic material such as quartz or AlN or $Al_2O_3$. In particular, the susceptor 5 and the support member 4 may be made of AlN having high thermal conductivity. A guide ring 8 for guiding the wafer W is provided at an outer edge of the susceptor 5. Further, a resistance heating type heater 6a is buried in the susceptor 5, the susceptor 5 is heated by feeding power from a heater power supply 6, and the wafer W supported by the susceptor 5 is heated by the heat. The temperature of the susceptor 5 is measured by a thermocouple 20 inserted into the susceptor 5. A control unit 21 controls current supplied to the heater from the heater power supply 6 based on a measurement value. For example, the temperature of the heater 6a is adjusted to a range of a room temperature to 1,000° C.

Further, a wafer support pin (not illustrated) for supporting and elevating the wafer W is provided in the susceptor 5. The wafer support pin may protrude upwardly of the susceptor 5 and retreat downwardly of the susceptor 5. A baffle plate 7 for evenly exhausting the inside of the chamber 1 is circularly provided outside the susceptor 5. The baffle plate 7 is supported by a plurality of pillars 7a. A cylindrical liner 42 made of quartz is provided on an inner periphery of the chamber 1. The liner 42 serves to prevent metal contamination from the chamber 1 made of the metallic material. The liner 42 may be made of ceramics ($Al_2O_3$, AlN, $Y_2O_3$, or the like) instead of quartz.

An exhaust pipe 23 is connected to the lateral side of the exhaust chamber 11. An exhaust device 24 including a high-speed vacuum pump is connected to the exhaust pipe 23. Gas in the chamber 1 is evenly discharged into a space 11a of the exhaust chamber 11 by actuating the exhaust device 24 and then exhausted through the exhaust pipe 23. Therefore, pressure in the chamber 1 may be rapidly dropped to approximately a predetermined degree of vacuum, for example, 2.67 Pa.

Carry-in and out ports for carrying the wafer W in and out the wafer W, and a gate valve opening and closing the carry-in and out ports are provided on a side wall of the housing 2 (all not illustrated). A gas introduction path for introducing processing gas into the chamber 1 is formed in the chamber 1. In detail, a circular passage 13 is formed by a step portion 18 formed on the top of the side wall of the housing 2 and a step portion 19 formed on the bottom of the chamber wall 3 to be described below.

The top of the chamber wall 3 engages with the microwave introduction unit 30 with a seal member 9c such as, for example, an O-ring. The bottom of the chamber wall 3 is joined with the top of the housing 2 with seal members 9a and 9b such as, for example, an O-ring. An airtight state is maintained between the chamber wall 3 and the microwave introduction unit 30 and between the chamber wall 3 and the housing 2 by the seal members. Further, a gas passage 14 is formed in the chamber wall 3.

A circular protrusion portion 17 that is extended downwardly in a skirt shape is formed on the bottom of the chamber wall 3. The protrusion portion 17 covers a boundary (an interface portion) between the chamber wall 3 and the housing 2 to prevent the seal member 9b having comparatively low plasma resistance from being directly exposed to plasma. Further, the step portion 19 is provided on the bottom of the chamber wall 3 so as to form the circular passage 13 through combination with the step portion 18 of the housing 2.

Further, a plurality of (for example, 32) gas introduction ports 15a is evenly provided on an inner periphery above the chamber wall 3. The gas introduction port 15a communicates with the gas passage 14 that is extended in a vertical direction in the chamber wall 3 through an introduction path 15b that is horizontally extended into the chamber wall 3.

The gas passage 14 is connected to a circular passage 13, which is configured by a groove formed by the step portion 18 and the step portion 19, at an interface portion between an upper portion of the housing 2 and a lower portion of the chamber wall 3. The circular passage 13 is circularly formed substantially in a horizontal direction to surround the processing space. Further, the circular passage 13 is connected with a passage 12, which is formed to be extended vertically in the side wall of the housing 2, at predetermined points (for example, four uniform points) in the housing 2, and the passage 12 is connected with a gas supply device 16. The circular passage 13 serves as a gas distributing unit that evenly supplies gas to each gas passage 14. A large amount of processing gas is prevented from being supplied to the processing space from a specific gas introduction port 15a by the circular passage 13.

As described above, in the present exemplary embodiment, since gas from the gas supply device 16 may be uniformly introduced from 32 gas introduction ports 15a through the passage 12, the circular passage 13 and each of the gas passages 14 into the chamber 1, uniformity of plasma in the chamber 1 may be increased.

As described above, since the chamber 1 is constituted by the housing 2 and the cylindrical chamber wall 3 placed thereabove, the chamber 1 is opened upwardly. The opening is air-tightly closed by the microwave introduction unit 30. However, the microwave introduction unit 30 is openable and closable by an opening and closing mechanism (not illustrated).

The microwave introduction unit 30 includes a transmission plate 28, an antenna 31 placed above the transmission plate 28, and a slow-wave member 33 placed on the top of the antenna 31. They are covered with a shield member 34. Further, the transmission plate 28, the antenna 31, and the slow-wave member 33 are fixed to a support member of an upper plate 27 via the O-ring by a circular press sing 35 having an L shape when viewed from a cross section through a support member 36. When the microwave introduction unit 30 is closed, the top of the chamber 1 and the upper plate 27 are sealed by the seal member 9c. Further, the antenna 31 and the slow-wave member 33 are supported on the upper plate 27 through the transmission plate 28.

The transmission plate 28 is made of ceramics such as a dielectric, in detail, quartz or $Al_2O_3$, AlN, sapphire, SiN, or the like. The transmission plate 28 serves as a microwave introduction window (dielectric window) that transmits the microwave and introduces the microwave into the processing space in the chamber 1. A bottom surface (opposite surface of the susceptor 5) of the transmission plate 28 is not limited to a flat type and for example, a concave portion or a groove may be formed in order to stabilize plasma by uniformizing the microwave. Since difference pressure between atmospheric pressure and internal pressure of a processing container is applied to the transmission plate 28, the thickness of the transmission plate 28 of the plate type needs to be 20 mm to 30 mm, but the thickness of the transmission plate 28 having a dome shape may be reduced by approximately 10% to 20%.

The bottom surface of the transmission plate 28 is supported on an outer peripheral thereof via the seal member 29, by a circular protrusion portion 27a that is radially extended inwardly from the upper plate 27. When the microwave introduction unit 30 is closed by the circular protrusion portion 27a, the inner part of the chamber 1 may be air-tightly maintained.

The antenna 31 has a disk shape. Further, the antenna 31 is suspended on an inner peripheral surface of the shield member 34 above the transmission plate 28. The surface of the antenna 31 is configured by, for example, a copper plate or an aluminum plate plated with gold or silver. A slot hole 32a (hereinafter, also referred to as slot 1) on an inner peripheral side and a slot hole 32b (hereinafter, also referred to as slot 2) on an outer peripheral side that penetrate the antenna 31 are formed in the antenna 31 in a predetermined pattern. The slot holes 32a, 32b radiate an electronic wave such as the microwave.

Figure 2:
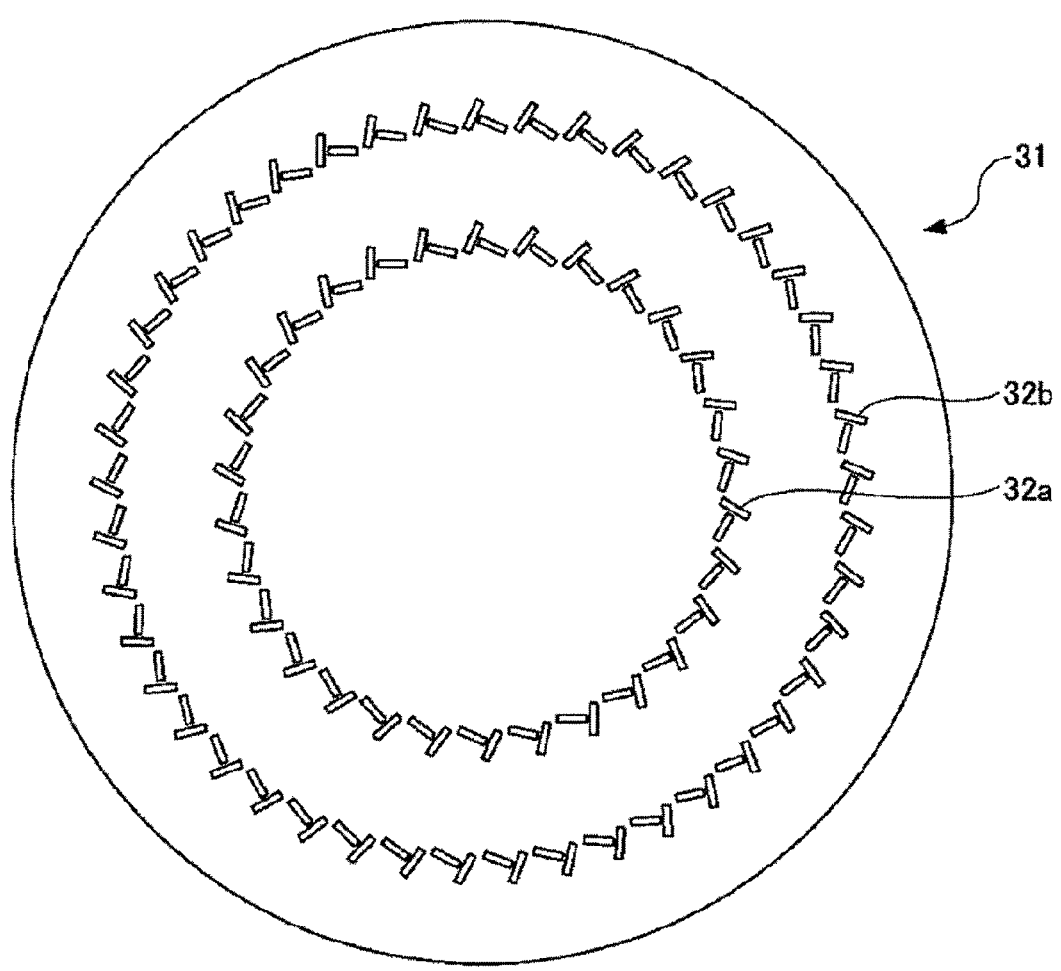
FIG. 2 is a plan view of an antenna according to the first exemplary embodiment.

As illustrated in FIG. 2, in the first exemplary embodiment, the slot holes 32a, 32b formed in the antenna 31 form a 'T' shape by combining two adjacent slot holes. The plurality of slot holes 32a, 32b is placed in a concentric shape as illustrated in FIG. 2. Further, the shapes of the slot holes 32a, 32b are not limited thereto, and may be a ring shape, an arc shape, or a spiral shape.

The slow-wave member 33 is provided on a top surface of the antenna 31. The slow-wave member 33 has permittivity higher than vacuum permittivity and is made of, for example, quartz, ceramics, a fluorine resin such as polytetrafluoroethylene, or a polyimide resin. A wavelength of the microwave in the slow-wave member 32 is shorter than a wavelength of a microwave in vacuum. That is, the slow-wave member 32 serves to adjust an electric wave of plasma. Further, the transmission plate 28 and the antenna 31 may be closely attached to or separated from each other. In addition, the antenna 31 and the slow-wave member 33 may be closely attached to or separated from each other.

A cooling water path (not illustrated) is formed in the shield member 34, and it is possible to cool the shield member 34, the slow-wave member 33, the antenna 31, the transmission plate 28, and the upper plate 27 by flowing cooling water on the cooling water path. Therefore, deformation or breakage of the members is prevented to generate stable plasma. Further, the shield member 34 is grounded.

A waveguide 37 is connected to an opening of the center of the shield member 34. A microwave generating device 39 is connected to an end of the waveguide 37 through a matching circuit 38. Therefore, a microwave having, for example, a frequency of 2.45 GHz, which is generated by the microwave generating device 39, is propagated to the antenna 31 through the waveguide 37. The frequency of the microwave may be 8.35 GHz, 1.98 GHz, or the like.

The waveguide 37 includes a coaxial waveguide 37a having a circular cross section, which is extended upwardly from the opening portion of the shield member 34, and a rectangular waveguide 37b connected to the top of the coaxial waveguide 37a through a mode converter 40. The mode converter 40 between the rectangular waveguide 37b and the coaxial waveguide 37a serves to convert a microwave propagated in a TE mode into a microwave in a TEM mode in the rectangular waveguide 37b. An internal conductor 41 is extended at the center of the coaxial waveguide 37a and the internal conductor 41 is connected and fixed to the center of the antenna 31 on the bottom thereof. Therefore, the microwave is efficiently and evenly propagated to the antenna 31 in a radial pattern.

A coil 52 for generating a magnetic field is wound in a radius direction of the chamber 1 around the side wall of the chamber 1, outside the chamber 1. When a power supply 53 is connected to the coil 52 and current from the power supply 53 flows on the coil 52, a perpendicular-direction (vertical-direction) magnetic field (hereinafter, referred to as a vertical magnetic field) to the chamber 1 is formed in the chamber 1. The size and a vertical direction of the magnetic field may be changed by changing a current value from the power supply 53. In the first embodiment, a horizontal-direction (transverse-direction) magnetic field (hereinafter, simply referred to as a transverse magnetic field) to the chamber 1 is not required.

Further, a permanent magnet may be provided instead of the coil 52. In this case, a plurality of pole type permanent magnets vertically polarized into N and S poles may be erected around the side wall of the chamber 1 or a permanent magnet having an N pole at any one side and an S pole at the other side among a ceiling and a bottom of the chamber 1 may be placed outside the chamber 1. As a result, the vertical magnetic field may be formed in the chamber 1.

A control unit 70 has a central processing unit (CPU), a read only memory (ROM) and a random access memory (RAM), which are not illustrated, and the CPU executes plasma processing according to various recipes stored in the storage areas. A process time, the temperature (the temperature of an upper electrode, the temperature of a side wall of the processing chamber, an ESC temperature, and the like) in the processing chamber, pressure (exhaust of gas), various process gas flow rates, and the like which are control information for the process condition are disclosed in the recipe. For example, the control unit 70 controls an output of the power supply 53 in order to control the vertical magnetic field formed in the chamber 1. Further, a function of the control unit 70 may be implemented by operating the control unit 70 by using software or implemented by operating the control unit 70 by using hardware.

As described above, the overall configuration of the radial line slot antenna apparatus 100 according to the embodiment has been described. In the radial line slot antenna apparatus 100 having the above configuration, when the microwave is introduced into the chamber 1, gas is excited by field energy of the introduced microwave and microwave plasma is generated. In the radial line slot antenna apparatus 100, when a specific plasma generating location is approximately just below the transmission plate 28 serving as the dielectric window that allows high-frequency power to pass, and when electron density of plasma just below the transmission plate is higher than frequency cutoff density of the high-frequency power, the microwave may not enter plasma and is propagated between the bottom surface of the transmission plate 28 and plasma, and some of the microwave is absorbed in plasma to used to hold plasma.

According to such a generation principle of plasma, the microwave plasma is high in electron density Ne and low in electron temperature Te of plasma as compared with capacitively coupled plasma (CCP), inductively coupled plasma (ICP), and electron cyclotron resonance plasma (EC), and therefore a high-quality product may be manufactured by plasma processing which is at high speed and is a little in damage.

[Electron Density of Plasma]
(Control by Slot Location)

Figure 3:
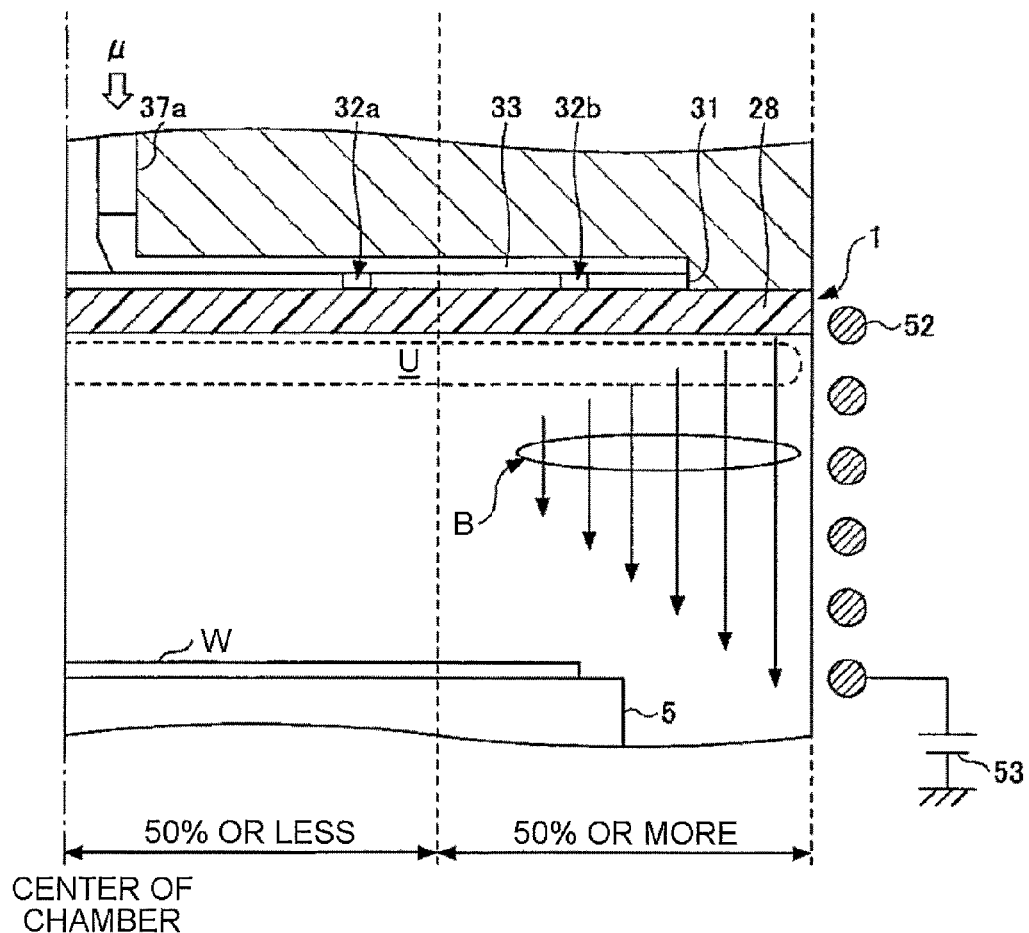
FIG. 3 is a diagram for describing a slot location and electron density of plasma according to the first exemplary embodiment.

As illustrated in FIG. 3, the microwave is propagated in the waveguide 37 (coaxial waveguide 37a), passes through the plurality of slot holes 32a, 32b from the slow-wave member 33, and transmits the transmission plate 28, and is thus introduced into the chamber 1. The microwave becomes a standing wave in the transmission plate 28. The standing wave forms a field intensity distribution in which lower portions of the slot holes 32a, 32b have maximum field intensity. Therefore, a distribution is formed, in which electron density of plasma formed in a plasma space U is highest at the lower portions of the slot holes 32a, 32b.

In the embodiment, the slot hole 32b is formed at a location radially spaced by 16 cm from a center location of the chamber 1, and the slot hole 32a is formed at a location radially spaced by 9 cm from the center location of the chamber 1. In the present exemplary embodiment, a diameter of the wafer W is 300 mm and in other words, the location of the slot hole 32b is positioned outside an outer edge of the wafer W. However, each slot location is not limited thereto. The slot hole 32b may be placed at a location of 50% or more spaced from the center location of the chamber 1 with respect to a radius of the chamber 1 and the slot hole 32a may be placed at a location of 50% or less from the center location of the chamber 1 with respect to the radius of the chamber 1.

When the antenna 31 has only the slot hole 32b, a peak of the electron density of generated plasma is at the lower portion of the slot hole 32b, that is, at the location of 50% or more spaced from the center location of the chamber 1. When the antenna 31 has only the slot hole 32a, a peak of the electron density of generated plasma is at the lower portion of the slot hole 32a, that is, at the location of 50% or less from the center location of the chamber 1. Therefore, the peak of the electron density of plasma when the slot hole 32b is formed is present on an outer peripheral side than the peak of the electron density of plasma when the slot hole 32a is formed. By this configuration, an electron density distribution of plasma may be controlled at locations where one or more slot holes are formed.

(Control by Magnetic Field)

Further, the electron density distribution of plasma may be controlled even by the vertical magnetic field. For example, FIG. 4 is a diagram illustrating a simulation result of the electron density distribution of plasma in a radius direction from the center of the chamber 1 by a contour line. FIG. 4A illustrates a case where the vertical magnetic field is not applied and FIG. 4B illustrates a case where the vertical magnetic field is applied.

As a precondition for executing a simulation, in the case of a process condition, a gas type was set as argon gas (Ar), a pressure in the chamber 1 was set to 20 mT (2.67 Pa), and the size of the vertical magnetic field was set to 10 G ($10^{-3}$ T).

As a result, the electron density Ne of plasma when the case where the magnetic field is not applied, which is illustrated in FIG. 4A, has a distribution in which the electron density Ne is higher at the center side than at the outer peripheral side of the chamber 1. As a result, an etching rate is also higher at the center side than at the outer peripheral side to cause uniformity of a process such as, for example, plasma etching to be short.

In particular, under a low-pressure condition of 50 mTorr (6.66 Pa) or less, the electron density Ne of plasma has a pronounced tendency to be higher at the center side and lower at the outer peripheral side, and thus, for example, the uniformity of plasma etching deteriorates. In particular, the reason why the electron density Ne of plasma is higher at the center side under the low-pressure condition is that it is difficult for electrons or ions in plasma to collide with each other and plasma is easily diffused in a low-pressure state. As a result, areas where the electron density Ne of plasma is high are concentrated on the center side, such that it is more difficult to control plasma.

Contrary to this, in the case of the electron density Ne of plasma when a vertical magnetic field B is applied, which is illustrated in FIG. 4B, areas where the electron density Ne of plasma is high move from the center side to the outer peripheral side. From the above result, it is seen that the vertical magnetic field B is applied to change the electron density distribution of plasma.

As such, the area where the electron density Ne of plasma is high moves from the center side to the outer peripheral side by the location of the slot and the application of the vertical magnetic field, thereby improving controllability of a plasma distribution. Herein, high controllability of the plasma distribution unit that the process condition is optimized to uniformize plasma. When the areas where the electron density Ne of plasma is high concentrate on the center side, it is difficult to optimize the process condition for uniformizing plasma. Contrary to this, when the area where the electron density Ne of plasma is high is positioned at the outer peripheral side (an area of at least 50% or more of the radius of the chamber 1), it is easy to optimize the process condition for uniformizing plasma.

As described above, while the slot is positioned at the location of at least 50% or more of the radius of the chamber 1 from the center side of the chamber 1, the vertical magnetic field B of approximately 10 G ($10^{-3}$ T) or more may be primarily applied to the chamber 1. In this case, a gap length between the wafer W and the transmission plate 28 may be equal to or less than the radius of the chamber 1.

Further, the process condition needs to be set such that at least a cyclotron frequency is higher than a collision frequency of electrons. Hereinafter, a relationship between the cyclotron frequency and the collision frequency of the electrons will be described.

[Cyclotron Frequency and Electron Collision Frequency of Plasma]

FIG. 5 is a graph illustrating a relationship between an electron collision frequency fe of plasma generated from argon (Ar) gas and a cyclotron frequency fc. In FIG. 5, a transverse axis indicates an electron temperature of plasma and a longitudinal axis indicates a collision frequency. A result of FIG. 5 may be obtained by a simulation based on a simulation condition and a process condition described below.

<Simulation Condition>

In a simulation performed in the embodiment, a plasma calculation method using a 2D bipolar diffusion approximation (2D quasi neutral plasma model) is used. For example, as the plasma calculation method using the 2D bipolar diffusion approximation, methods disclosed in Documents 1 and 2 below may be used.

Document 1: A. Tsuji, Y. Yasaka, S. Y. Kang, T. Morimoto, I. Sawada, Thin Solid Films 516, 4368, 2008

Document 2: J. Brcka and S. Y. Kang, Plasma Process. Polym. 6, S776, 2009

<Process Condition>

Pressure in chamber 1: 20 mT (2.67 Pa), 200 mT (26.7 Pa), 2 T (267 Pa)

Microwave power: 3 kW

Gas type/gas flow rate: Argon gas (Ar) 1,000 sccm

Vertical magnetic field: 1 G to 50 G ($10^{-4}$ T to $50^{-3}$ T)

The electron collision frequency fe of plasma may be expressed by a frequency at which electrons collide with particles (in this case, argon particles) in the chamber 1. In the simulation, the electron collision frequency fe of plasma is approximately acquired by multiplying a reaction rate constant of argon gas (a reaction rate constant in elastic collision of electrons and neutral particles (in this case, argon particles)) by the density of gas. The reaction rate constant of argon gas is acquired by using Equation 1 below.

$$2.347 \times 10^{-18} T_{e[K]} \exp\left(-\frac{1779}{T_{e[K]}}\right) \quad \text{[Equation 1]}$$

Herein, $T_{e[k]}$ in Equation 1 represents an electron temperature of plasma.

Based on the result of the simulation, the electron collision frequencies fe of argon plasma at 20 mT, 200 mT, and 2 T and the cyclotron frequencies fc of three patterns at 1 G ($10^{-4}$ T), 5 G ($50^{-4}$ T), and 50 G ($50^{-3}$ T) are illustrated in FIG. 5.

According to the simulation result of FIG. 5, it can be seen that the electron collision frequency fe of plasma is changed depending on a pressure and the electron temperature of plasma. In detail, as the pressure increases, the electron collision frequency fc of plasma increases. The reason is that as the pressure increases, the number of electrons present in a plasma space increases such that the collision frequency of the electrons increases.

Further, as the electron temperature of plasma increases, the electron collision frequency fe of plasma increases. The reason is that as the electron temperature of plasma increases, a movement speed of the electron increases such that the electron collision frequency increases. Further, the electron collision frequency fe of plasma is changed even depending on the gas type.

Meanwhile, it can be seen that the cyclotron frequency fc of FIG. 5 is changed depending on the size of the applied vertical magnetic field. In detail, as the vertical magnetic field increases, the cyclotron frequency fc increases. However, the cyclotron frequency fc is not changed depending on the level of the electron temperature of plasma. The cyclotron frequency fc is acquired by using Equation 2 below.

$$fc = \frac{q[c]B[T]}{m_e[kg]} \times \frac{1}{2\pi} \quad \text{[Equation 2]}$$

Herein, q represents an elementary charge, $m_e$ represents a mass of the electron, and B represents the magnetic field.

A condition needs to be met, which 'the cyclotron frequency fc when the vertical magnetic field is applied is higher than the electron collision frequency fe of plasma', in order for the application of the vertical magnetic field and the application of the magnetic field including the vertical magnetic field and the transverse magnetic field to influence the controllability of the plasma distribution. The reason will be described below. By considering movement of electrons in plasma, when the electron collision frequency fe is higher than the cyclotron frequency fc, a frequency at which the electrons collide with particles in the chamber 1 is relatively high, and as a result, even though the vertical magnetic field is applied, a probability that the electrons move due to the vertical magnetic field is relatively low. That is, when the electron collision frequency fe is higher than the cyclotron frequency fc, the electrons predominately collide with the particles in the chamber 1, and as a result, it is difficult to control the electrons by the vertical magnetic field. Therefore, when the electron collision frequency fe is higher than the cyclotron frequency fc, it is difficult to shift the area where the electron density of plasma is high from the center side to the outer peripheral side.

Meanwhile, when the cyclotron frequency fc is higher than the electron collision frequency fe, the frequency at which the electrons collide with the particles in the chamber 11 is relatively decreased, and as a result, a probability that the electrons move due to the applied vertical magnetic field is relatively increased. That is, when the cyclotron frequency fc is higher than the electron collision frequency fe, the electrons predominately move due to the vertical magnetic field, and as a result, it is possible to control the electrons by the vertical magnetic field. Therefore, when the cyclotron frequency fc is higher than the electron collision frequency fe, it is possible to shift the area where the electron density of plasma is high from the center to the outer peripheral side. Therefore, it is possible to improve the controllability of the plasma distribution.

Actually, in order to meet a condition that the cyclotron frequency fc is higher than the electron collision frequency fe, the vertical magnetic field, the pressure, the electron temperature of plasma, and the like need to be optimized.

For example, it is possible to meet the condition that the cyclotron frequency fc is higher than the electron collision frequency fe, by the vertical magnetic field controlled by the control unit 70.

As described above, when the magnetic field is not applied, the controllability of the plasma distribution tends to deteriorate as the pressure becomes lower. However, according to the simulation result of FIG. 5, a larger vertical magnetic field needs to be applied as the pressure becomes higher, in order to meet the condition that the cyclotron frequency fc is higher than the electron collision frequency fe of plasma. Contrary to this, the condition may be met even in a smaller vertical magnetic field as the pressure becomes lower. Therefore, in the plasma control using the vertical magnetic field according to the embodiment, one of the features is that it is possible to effectively control plasma as the pressure becomes lower.

Further, according to the simulation result of FIG. 5, the condition that the cyclotron frequency fc is higher than the electron collision frequency fe of plasma is met in an area at a low electron temperature. Therefore, in the embodiment, one of the features is that it is possible to effectively control the plasma distribution in an area at a lower electron temperature. The radial line slot antenna apparatus 100 that performs plasma processing according to the embodiment has one of the features, even that the plasma control and compatibility of the embodiment are also excellent because plasma at the low electron temperature may be generated.

As described above, by the plasma control according to the embodiment, it is possible to edge-shift the area where the electron density of plasma is high from the center side to the outer peripheral side, in particular, at a low-pressure state without greatly influencing ion flux by using a vertical magnetic field having a predetermined degree of intensity, by optimization of the location of the slot or the applied vertical magnetic field. Therefore, it is possible to improve the controllability of the plasma distribution.

Herein, the vertical magnetic field having a predetermined degree of intensity represents a vertical magnetic field of approximately 1 G to 50 G ($10^{-4}$ T to $50^{-3}$ T). When an influence by the magnetic field on the wafer W during the process is considered, it is not preferable to apply a vertical magnetic field having a larger intensity during the process. The plasma control according to the embodiment is excellent even in that the plasma control by the small vertical magnetic field of approximately 1 G to 50 G ($10^{-4}$ T to $50^{-3}$ T) may be executed without influencing the process.

However, when the vertical magnetic field in the range of 1 G to 50 G ($10^{-4}$ T to $50^{-3}$ T) is applied, a pressure band, which meets the condition that the cyclotron frequency fc is higher than the electron collision frequency fe of plasma, is changed depending on the gas type and the electron temperature of plasma. In the plasma generated from the argon gas of FIG. 5, in order to meet the condition that the cyclotron frequency fc is higher than the electron collision frequency fe of plasma, the electron temperature of plasma is preferably in the range of 0.5 eV to 5 eV and the pressure in the chamber is controlled to be 20 mT to 200 mT (2.67 Pa to 26.7 Pa).

[Optimization of Slot Location and Magnetic Field]

Next, a simulation result, which is performed for achieving optimizeness of the slot location [slot 1 and slot 2] and optimizeness of the magnetic field (vertical magnetic field and transverse magnetic field), will be described. In the simulation, the plasma calculation method using the 2D bipolar diffusion approximation is used. Slot 1 is the slot hole 32a illustrated in FIG. 3 and a through-hole formed at the location of the 9 cm radius from the center location of the chamber 1. Slot 2 is the slot hole 32ba illustrated in FIG. 3 and a through-hole formed at the location of the 16 cm radius from the center location of the chamber 1.

Figure 6:
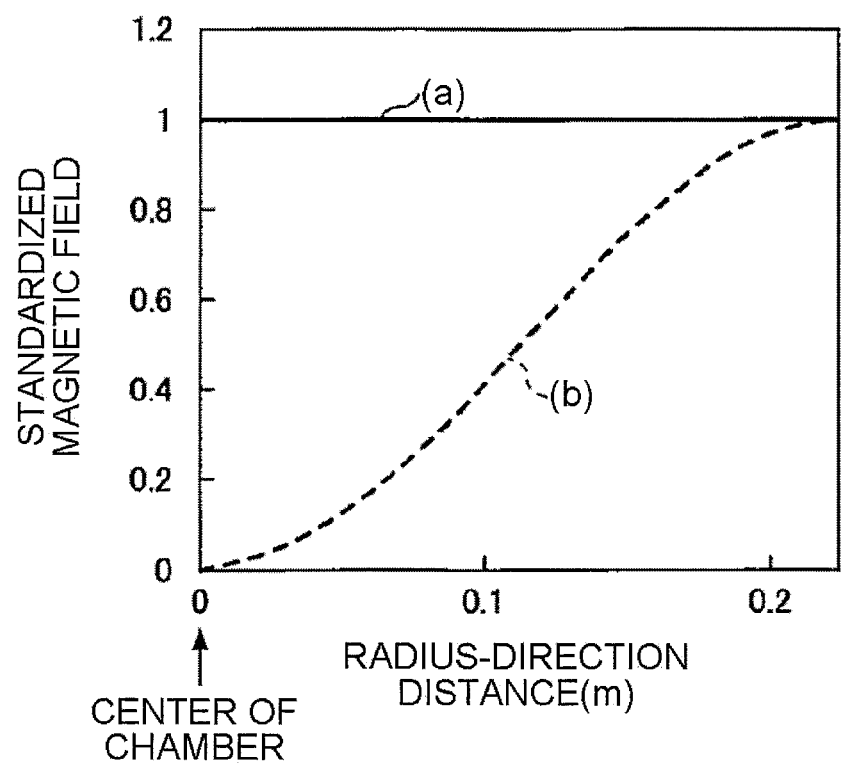
FIG. 6 is a diagram illustrating an intensity distribution of a magnetic field used in a simulation of controlling plasma by the magnetic field according to the first exemplary embodiment.

As a simulation condition of FIG. 6, in two cases of (a) a case where the magnetic field is evenly applied in the radius direction of the chamber; and (b) a case where a strong magnetic field is applied toward the outer peripheral side from the center of the chamber in the radius direction of the chamber (hereinafter, a case where the magnetic field is slantly applied), a simulation result when the vertical magnetic field is applied to the chamber is calculated. The result is illustrated in FIG. 7.

Figure 7A:
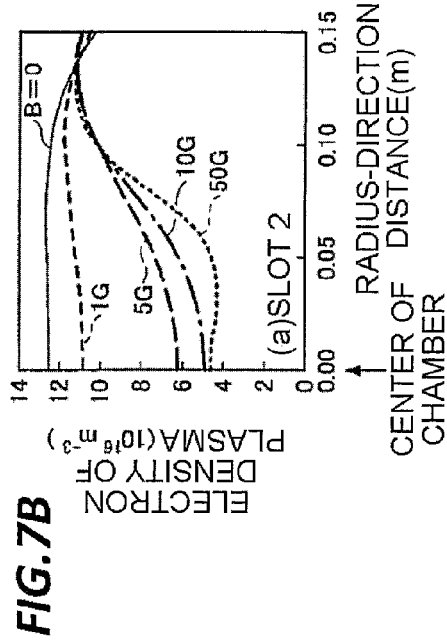
FIGS. 7A-7D are diagrams illustrating a simulation result of the electron density distribution of plasma by a vertical magnetic field according to the first exemplary embodiment.

In detail, FIG. 7A illustrates the electron density Ne of plasma in the radius direction in a case where slot 1 (the slot hole 32a at the center side of FIG. 3) is formed in the antenna 31 as a case where the vertical magnetic field is evenly applied as illustrated in FIG. 6A.

Figure 7B:
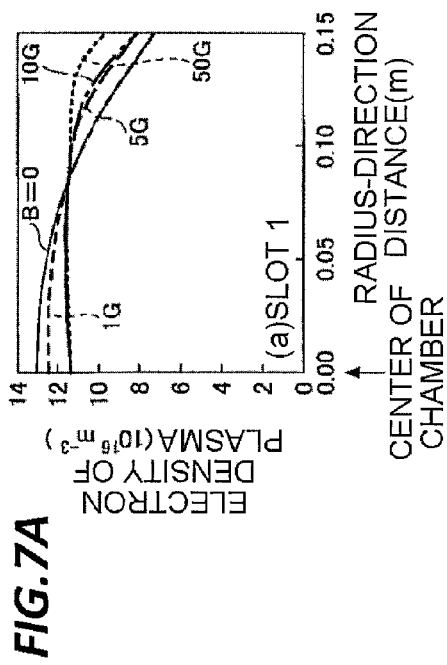

FIG. 7B illustrates the electron density Ne of plasma in the radius direction in a case where slot 2 (the slot hole 32b at the outer peripheral side of FIG. 3) is formed in the antenna 31 as the case where the vertical magnetic field is evenly applied as illustrated in FIG. 6A.

Figure 7C:
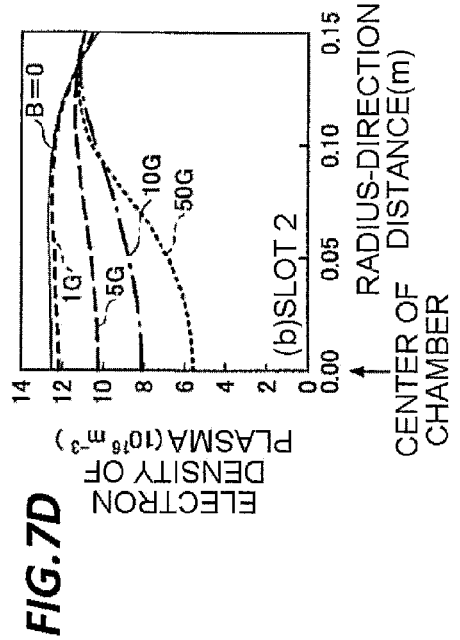

FIG. 7C illustrates the electron density Ne of plasma in the radius direction in the case where slot 1 (the slot hole 32a at the center side of FIG. 3) is formed in the antenna 31 as a case where the vertical magnetic field is slantly applied as illustrated in FIG. 6B.

Figure 7D:
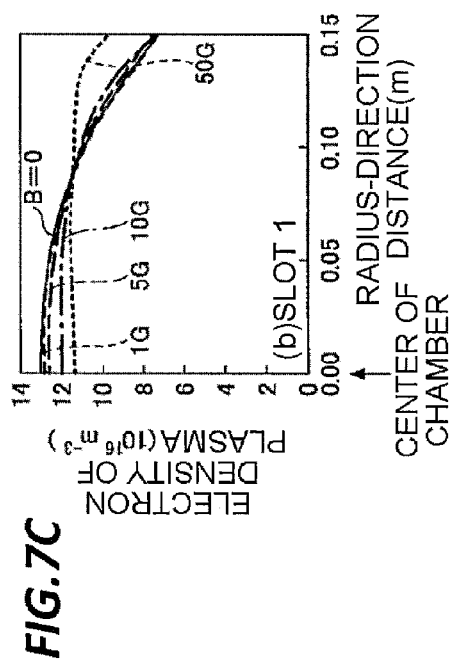

FIG. 7D illustrates the electron density Ne of plasma in the radius direction in the case where slot 2 (the slot hole 32b at the outer peripheral side of FIG. 3) is formed in the antenna 31 as the case where the vertical magnetic field is slantly applied as illustrated in FIG. 6B.

As a result, referring to FIGS. 7A to 7D, when the vertical magnetic field is applied [1 G ($10^{-4}$ T), 5 G ($50^{-4}$ T), 10 G ($10^{-3}$ T), 50 G ($50^{-3}$ T)], it can be seen that the peak of the electron density Ne of plasma may be moved from the center side to the outer peripheral side, as compared with the case where the magnetic field is not applied (B=0). In this case, when the vertical magnetic field is applied (1 G, 5 G, 10 G, and 50 G), the controllability of the plasma distribution by the magnetic field becomes higher as a variation width of the electron density distribution of plasma becomes larger, as compared with the case where the magnetic field is not applied (B=0).

From this point of view, when FIGS. 7A to 7D are considered, it can be seen that the controllability of the plasma distribution is higher at the location of slot 2 illustrated in FIGS. 7B and 7D than at the location of slot 1 illustrated in FIGS. 7A and 7C. Further, it can be seen that the controllability of the plasma distribution is higher in 'the case where the vertical magnetic field is evenly applied' of FIGS. 7A and 7B than in 'the case where the vertical magnetic field is slantly applied' of FIGS. 7C and 7D.

From the above, it can be seen that when the vertical magnetic field is applied into the chamber, the following effects may be obtained.

(1) When the vertical magnetic field is applied, the area where the electron density Ne of plasma is high may be moved from the center side to the outer peripheral side, thereby improving the controllability of the plasma distribution, as compared with the case where the magnetic field is not applied (B=0).

(2) When slot 2 at the outer peripheral side is formed, the influence on the electron density Ne of plasma by the vertical magnetic field may become larger and the area where the electron density Ne of plasma is high may be moved more largely from the center side to the outer peripheral side, thereby further improving the controllability of the plasma distribution, as compared with the case where slot 1 at the center side is formed.

(3) When the magnetic field is evenly applied, the peak of the electron density Ne of plasma may be moved more largely from the center side to the outer peripheral side, thereby further improving the controllability of the plasma distribution, as compared with the case where the magnetic field is not evenly applied.

Therefore, it can be seen that when the slot is formed at the outer peripheral side (the location of 50% or more spaced from the center location of the chamber) like slot 2, and the even vertical magnetic field is applied to the chamber, particularly the controllability of the plasma distribution may be improved.

Figure 8:
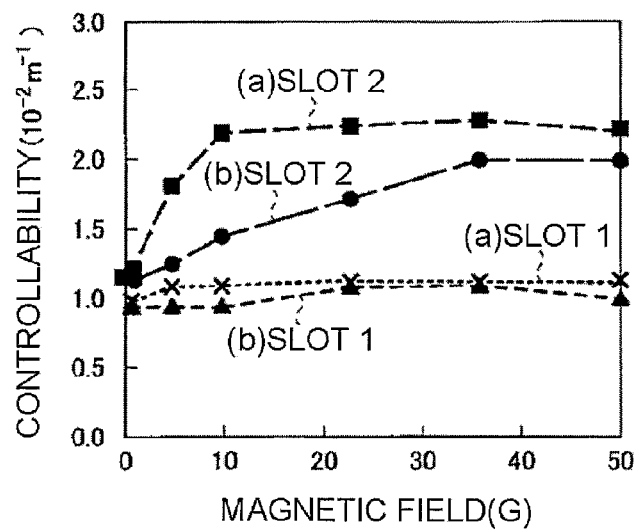
FIG. 8 is a diagram illustrating controllability of a plasma distribution by the vertical magnetic field according to the first exemplary embodiment.

The result is digitized as controllability of plasma distribution and illustrated in FIG. 8. The controllability of plasma distribution is calculated by using the following Equation 3.

$$\text{controllability} = \int_0^{0.15[m]} n_e r \, dr \qquad \text{[Equation 3]}$$

Here, in Equation 3, $n_e$ represents an electron density of the plasma. A location r represents a radial location of the wafer from a center of the wafer W to an outer edge of the wafer W (edge of the wafer). That is, Equation 3 is a value obtained by integrating the product of the electron density $n_e$ of the plasma and the location r thereof from 0 mm to 150 mm in a radial direction of the wafer.

In Equation 3, as the electron density $n_e$ of the plasma at the outer peripheral side of the wafer W is increased, the controllability of plasma distribution is increased.

Referring to FIG. 8, as described above, the highest controllability is illustrated in '(a) slot 2' of FIG. 8. In this case, the location of the slot is formed at the slot 2 of the outer peripheral side, and a uniformly vertical magnetic field is applied. The second highest controllability is the location of the slot is formed at the slot 2 of the outer peripheral side, and the vertical magnetic field is slantly applied, as illustrated in '(b) slot 2' of FIG. 8.

The third highest controllability is the location of the slot is formed at the slot 1 of an inner peripheral side, and a uniform magnetic field is applied, as illustrated in '(a) slot 1' of FIG. 8. The lowest controllability is the location of the slot is formed at the slot 1 of the inner peripheral side, and the vertical magnetic field is slantly applied, as illustrated in '(b) slot 1' of FIG. 8. Hereinabove, an influence which the slot location and the vertical magnetic field give to the controllability of plasma distribution is verified.

Next, when the applied magnetic field is a transverse magnetic field, an influence which the slot location and the horizontal magnetic field give to the controllability of plasma distribution will be verified. In detail, FIG. 9A illustrates an electron density Ne of plasma of a radial direction in the case where the slot 1 (the slot hole 32a at the center side of FIG. 3) is formed in the antenna 31, as a case where the horizontal magnetic field is uniformly applied as illustrated in FIG. 6A.

Figure 9A:
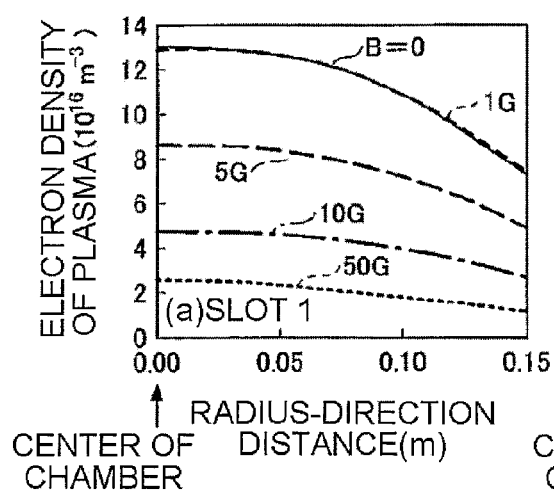
FIGS. 9A-9B are diagrams illustrating a simulation result of the electron density distribution of plasma by a transverse magnetic field according to the first exemplary embodiment.
Figure 9B:
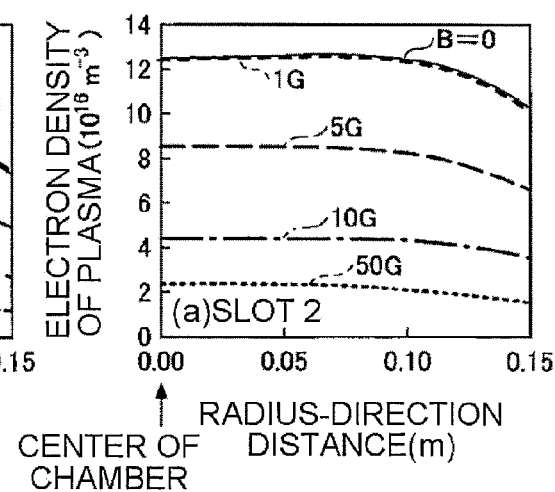

FIG. 9B illustrates an electron density Ne of plasma of a radial direction in the case where the slot 2 (the slot hole 32b of the outer peripheral side of FIG. 3) is formed in the antenna 31, as a case where the horizontal magnetic field is uniformly applied as illustrated in FIG. 6A.

According to FIGS. 9A and 9B, when the cases (1 G, 5 G, 10 G, and 50 G) where the horizontal magnetic field is applied are compared with the case (B=0) where the horizontal magnetic field is not applied, it is verified that the horizontal magnetic field does not almost affect the distribution of the electron density Ne of plasma. In detail, even though the horizontal magnetic field is applied, a peak of the electron density Ne of plasma does not move to the outside, and similarly to the case where the magnetic field is not applied, the electron density Ne of plasma at the center is high, and the electron density Ne of plasma at the outside is low. That is, even though the horizontal magnetic field is applied, since the electron density Ne of plasma is biased at the center, it can be seen that there is no uniformity of the plasma, and the controllability of plasma distribution is low.

From the above simulation result, it can be seen that the magnetic field used for the control of the plasma in the embodiment needs to be the vertical magnetic field applied in a vertical direction of the chamber and there is no point to apply the horizontal magnetic field.

According to Fleming's left-hand law, when the horizontal magnetic field is applied such that force is applied to the outside, the electrons move in a vertical direction, and the movement of the electrons in a horizontal direction is constrained. That is, the movement of the electrons in a radial direction of the chamber is constrained. Accordingly, even though the horizontal magnetic field is applied, the electron density of plasma is not shifted from the center to the outside. As a result, even though the horizontal magnetic field is applied, it is difficult to increase the controllability of plasma distribution. Meanwhile, when the vertical magnetic field is applied such that the force is applied to the outside, the electrons move in a horizontal direction, and the movement of the electrons in the vertical direction is constrained. That is, the movement of the electrons in a radial direction of the chamber is not constrained. Accordingly, when the vertical magnetic field is applied, the electron density of plasma is shifted from the center to the outside. As a result, when the vertical magnetic field is applied, the controllability of plasma distribution may be increased. Hereinabove, in the control of the plasma according to the embodiment, it is necessary to apply the vertical magnetic field.

[Pulse Control of Vertical Magnetic Field]

Finally, a simulation result in the case where a vertical magnetic field is applied as a pulse type will be described. In the simulation, a plasma calculation using 2D bipolar diffusion approximation is used. When a slot is provided at a location of the slot 2, and a magnetic field is turned on, a vertical magnetic field of 10 G is applied.

Figure 10:
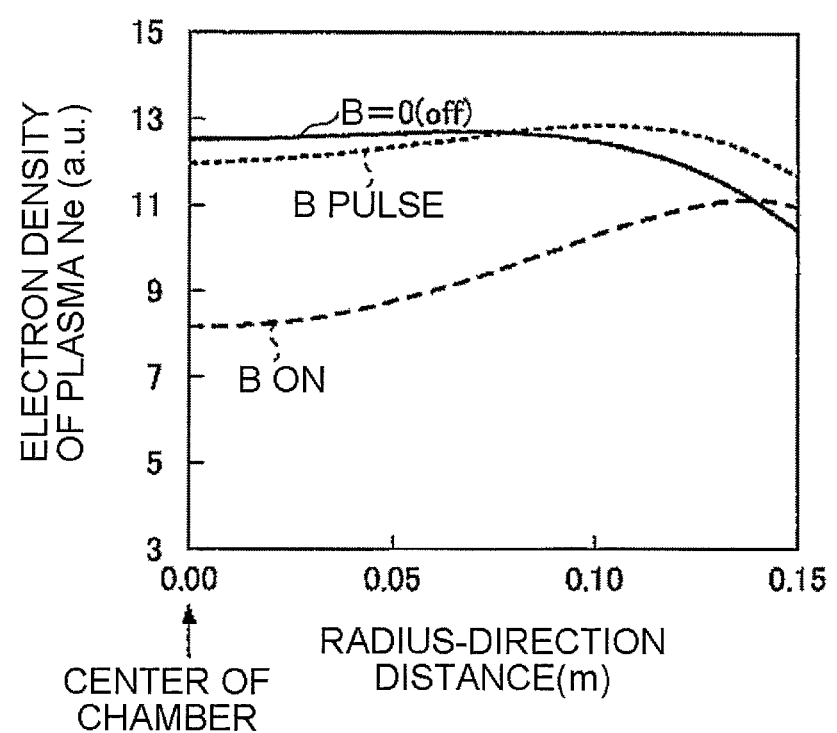
FIG. 10 is a diagram illustrating a simulation result of the electron density distribution of plasma by a pulse type magnetic field according to the first exemplary embodiment.

The result is illustrated in FIG. 10. A transverse axis of FIG. 10 represents a distance in the radial direction of the wafer, and a vertical axis thereof represents the electron density Ne of plasma. A curve of 'B on' represents the electron density Ne of plasma in the case where the vertical magnetic field of 10 G is continuously applied, and a curve of 'B=0' represents the electron density Ne of plasma in the case where the magnetic field is not applied. A curve of 'B pulse' represents the electron density Ne of plasma when applying the vertical magnetic field of a pulse type, in which ON and OFF of the vertical magnetic field are repeated by controlling ON and OFF of the vertical magnetic field in time division.

The curve of 'B pulse' is time average distribution of the curve of 'B on' and the curve of 'B=0', and an electron density distribution Ne of plasma becomes more flat. That is, in the case where the pulse type of vertical magnetic field is applied, the electron density distribution of plasma having higher uniformity is acquired as compared with the case where the vertical magnetic field is continuously applied. Further, in the case where the pulse type of vertical magnetic field is applied (the curve of 'B pulse'), an area having high electron density Ne of plasma may be further shifted to the outside, thereby further improving the controllability of plasma distribution. Meanwhile, the pulse control of the vertical magnetic field is performed by the control 70. The control unit 70 switches ON and OFF of the application of the vertical magnetic field in time division and pulse-controls the vertical magnetic field.

Second Exemplary Embodiment

In a method in the related art, it was difficult to control the plasma distribution under a low-pressure condition of 1 mTorr (0.133 Pa) to 50 mTorr (6.66 Pa). As one scheme for controlling the plasma distribution under the low-pressure condition, narrowing a gap, which is a distance from the top surface of the wafer to the bottom surface of the ceiling of the chamber 1, is considered. However in this case, there is high possibility that damage to the wafer will be caused during the process because the temperature of the wafer is increased by irradiation of plasma. Further, since a distribution of a standing wave unique to the surface wave plasma influences processing of the wafer, such as, for example, non-uniformity of the etching rate, the scheme is not a good idea.

[Outline of Apparatus Configuration]

On the contrary, in a radial line slot antenna apparatus 100 according to a second embodiment, a relatively small magnetic field of about 1 G ($10^{-4}$ T) to 50 G ($50^{-3}$ T) having two components of a vertical magnetic field and a horizontal magnetic field is applied. As a result, a method of controlling plasma distribution even under the low-pressure condition of 1 mTorr to 50 mTorr is seen. Hereinafter, a configuration of the radial line slot antenna apparatus 100 according to the second embodiment and a control of the plasma distribution using the apparatus will be described.

A basic configuration of the radial line slot antenna apparatus 100 according to the second embodiment is the same as the configuration of the radial line slot antenna apparatus 100 according to the first embodiment illustrated in FIG. 1.

Figure 11:
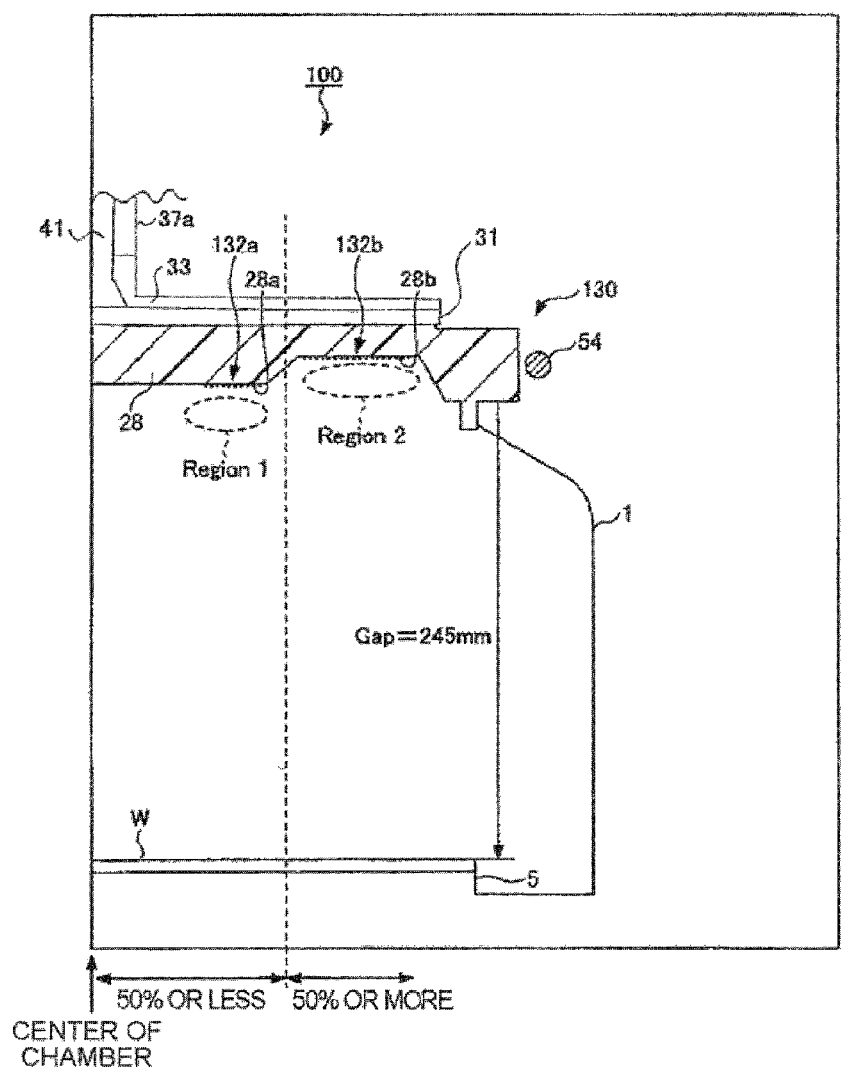
FIG. 11 is a longitudinal cross-sectional view illustrating an antenna unit of a radial line slot antenna apparatus according to a second exemplary embodiment.

The configuration of the radial line slot antenna apparatus 100 according to the second embodiment is different from the configuration of the radial line slot antenna apparatus 100 according to the first embodiment in that the slot holes 32a and 32b formed in the first embodiment are not formed in the second embodiment. In the second embodiment, instead, as illustrated in FIG. 11, a concave portion 28b is formed at an outer peripheral side of a bottom surface of the transmission plate 28 provided on a ceiling of the radial line slot antenna apparatus 100.

An antenna unit 130 of the second embodiment includes the transmission plate 28, and supplies a microwave propagated from a surface of the internal conductor 41 into the chamber 1. Meanwhile, the antenna unit of the first embodiment includes the antenna 31 and the transmission plate 28, and supplies the microwave propagated from the surface of the internal conductor 41 into the chamber 1. A power supply unit in each embodiment corresponds to the antenna unit supplying high frequency power into the chamber 1 from a specific plasma generating location.

When passing through the transmission plate 28 from the center of the antenna unit 130, the microwave is introduced into the chamber 1 through a propagation path defined by the formation of the concave portion 28b. That is, the concave portion 28b is formed at the outer peripheral side of the bottom surface of the transmission plate 28, and as a result, the microwave passing through the transmission plate 28 is output into the chamber 1 from the internal center of the concave portion 28b and an end vicinity 28a at the center of the concave portion 28b as the main propagation paths. Accordingly, field intensities at the internal center of the concave portion 28b and the end vicinity 28a at the center of the concave portion 28b are higher than the field intensities at other portions of the bottom surface of the transmission plate 28. As a result, locations of the internal center of the concave portion 28b and the end vicinity 28a at the center of the concave portion 28b become a main power absorption location of the plasma. Hereinafter, an inner plasma generating location 132a is disposed directly below the location of the end vicinity 28a at the center of the concave portion 28b, and an outer plasma generating location 132b is disposed directly below the location of the internal center of the concave portion 28b. A plasma generating region 1 (Region 1) is formed below the inner plasma generating location 132a, and a plasma generating region 2 (Region 2) is formed below the outer plasma generating location 132b.

In the propagation path of the microwave and the output state thereof in the chamber 1, which are described above, the slot hole of the first embodiment and the concave portion of the second embodiment have the same function.

The concave portion 28b is disposed at a location of 50% or more spaced from the center location of the chamber 1 with respect to a diameter of the chamber 1. In the embodiment, the specific plasma generating location includes at least an outer plasma generating location 132b. That is, the outer plasma generating location 132b is an example of the specific plasma generating location, and may be disposed at a location of 50% or more spaced from the center location of the chamber 1 with respect to the diameter of the chamber 1, and the inner plasma generating location 132a may be disposed at any one location. In the embodiment, the inner plasma generating location 132a is disposed at a location of 50% or less from the center location of the chamber 1 with respect to a diameter of the chamber 1. The specific plasma generating location is not limited to the location of the outer plasma generating location 132b in the embodiment, but one or two or more specific plasma generating locations may be provided at a location of 50% or more spaced from the center location of the chamber 1 with respect to a diameter of the chamber 1. Further, the specific plasma generating location may be formed further outside than a peripheral edge of the wafer disposed in the chamber 1.

Figure 12:
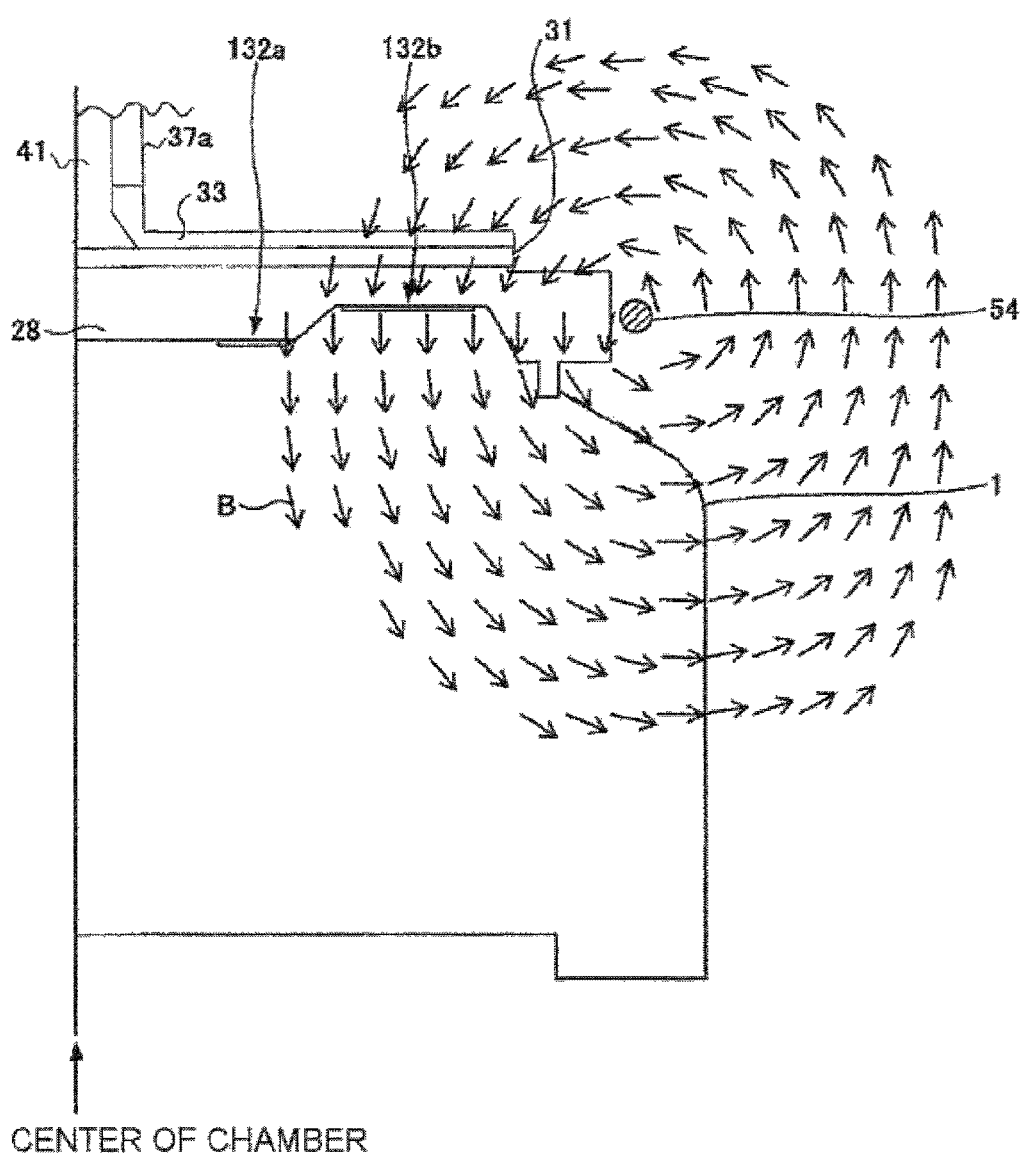
FIG. 12 is a diagram illustrating a magnetic field formed in the second exemplary embodiment.

In the embodiment, an electromagnet 54 is provided in a ring shape to surround the chamber 1 at a side wall of the antenna unit 130 outside the chamber 1. However, a layout or a shape of the electromagnet 54 is not limited thereto, and the electromagnet 54 may be provided at any one location of the outer peripheral side of the chamber 1 at the upper portion or the lateral portion of the ceiling of the chamber 1. The outer peripheral side of the chamber 1 is a location of 50% or more spaced from the center location of the chamber 1 with respect to a diameter of the chamber 1. Particularly, the electromagnet 54 may be provided around an outer end of the ceiling of the chamber 1. Further, the electromagnet 54 may be provided around the plasma generating location. As a result, as illustrated in FIG. 12, a concentric circular magnetic field B around the electromagnet 54 around the outer end of the ceiling of the chamber 1 is generated. The electromagnetic 54 forms a magnetic field including a vertical direction component and a component outwards in a diameter direction of the chamber 1 inside the chamber 1. Meanwhile, even though a magnetic field in a reverse direction to the magnetic field illustrated in FIG. 12, that is, a magnetic field in a clockwise direction is formed in addition to a magnetic field in a counterclockwise direction illustrated in FIG. 12, it is possible to acquire an effect that the electrons move to the outer peripheral side of the chamber 1. In this case, the magnetic field in a reverse direction to the magnetic field illustrated in FIG. 12 may be formed by running a current in a reverse direction to the electromagnet 54 illustrated in FIG. 12.

The electromagnet 54 is provided outside the chamber 1 and an example of a magnetic field forming unit of forming a magnetic field including at least the vertical magnetic field at least at the specific plasma generating location. The magnetic field forming unit may be a permanent magnet. The coil 52 of the first embodiment is an example of the magnetic field forming unit, but the magnetic field formed by the magnetic field forming unit of the first embodiment does not include a magnetic field (transverse magnetic field) in a diameter direction of the chamber 1. Meanwhile, the magnetic field formed by the magnetic field forming unit of the second embodiment includes a vertical direction component and a component outwards in the diameter direction.

Further, in the embodiment, a gap from the ceiling of the chamber 1 to the wafer W is set such that the magnetic field formed by the electromagnet 54 does not reach the wafer W. In the embodiment, as illustrated in FIG. 11, a gap from the upper surface of the wafer W to the lower surface of the ceiling is 245 mm. The gap may be any distance by which the electric field formed by the electromagnet 54 does not reach the wafer W.

Further, in the first embodiment, the relationship between the electron collision frequency fe of plasma and the cyclotron frequency fc is described with reference to FIG. 1, but even in the second embodiment, the magnetic field is controlled such that the relationship between the electron collision frequency fe of the plasma formed in the chamber 1 and the cyclotron frequency fc becomes fc>fe.

Hereinabove, the configuration of the radial line slot antenna apparatus 100 according to the second embodiment has been described.

[Magnetic Field]
(Plasma Control by Magnetic Field)

Figure 13:
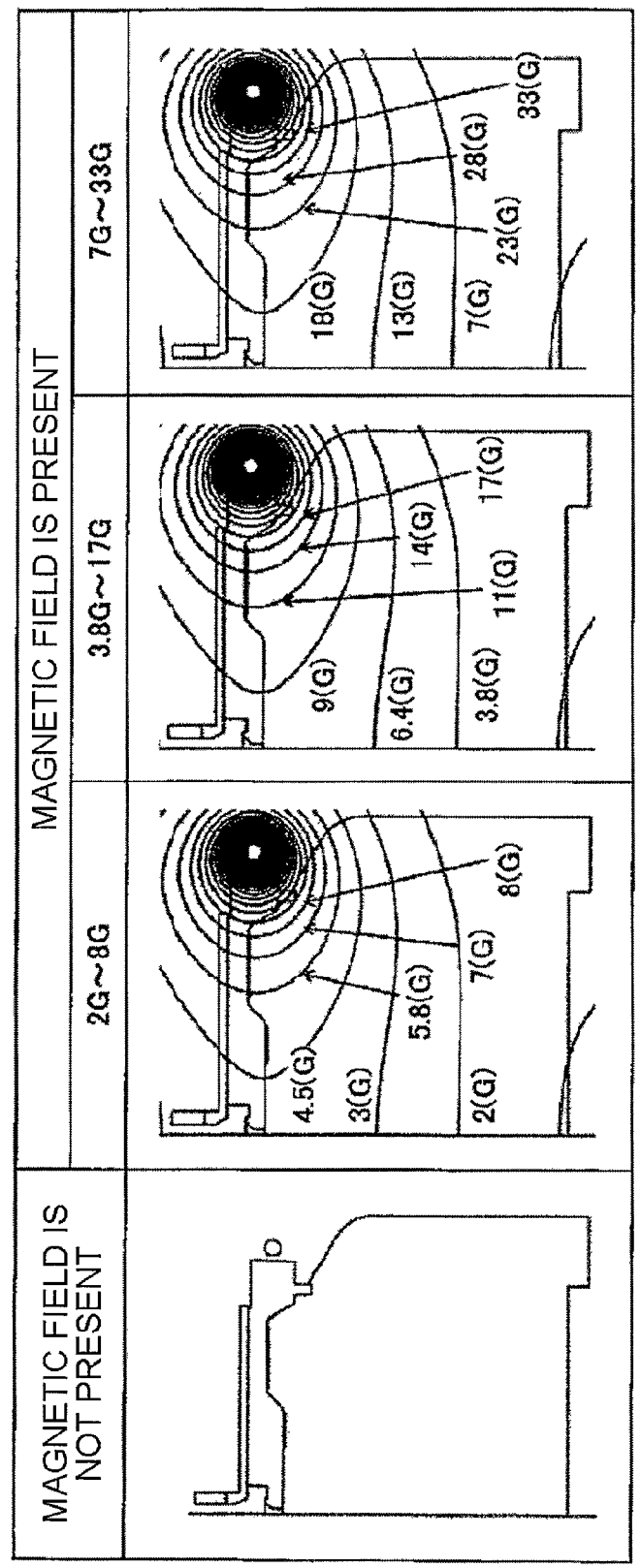
FIG. 13 is a diagram illustrating a state of the magnetic field according to the second exemplary embodiment by a contour line.

Next, in the radial line slot antenna apparatus 100 having the aforementioned configuration, a simulation how a plasma state in the plasma generating region is changed by presence of the electromagnet 54 and a magnitude of a magnetic flux density is performed. FIG. 13 illustrates a contour line of the magnetic field used in the simulation. In the simulation, a case where three kinds of magnetic fields of a magnetic field of 2 G to 8 G ($2\times10^{-4}$ T to $8\times10^{-4}$ T), a magnetic field of 3.8 G to 17 G ($3.8\times10^{-4}$ T to $1.7\times10^{-3}$ T), and a magnetic field of 7 G to 33 G ($7\times10^{-4}$ T to $3.3\times10^{-3}$ T) are formed as relatively small magnetic fields and a case where the magnetic field is not formed are set as a condition of the simulation for the magnetic field.

Figure 14:
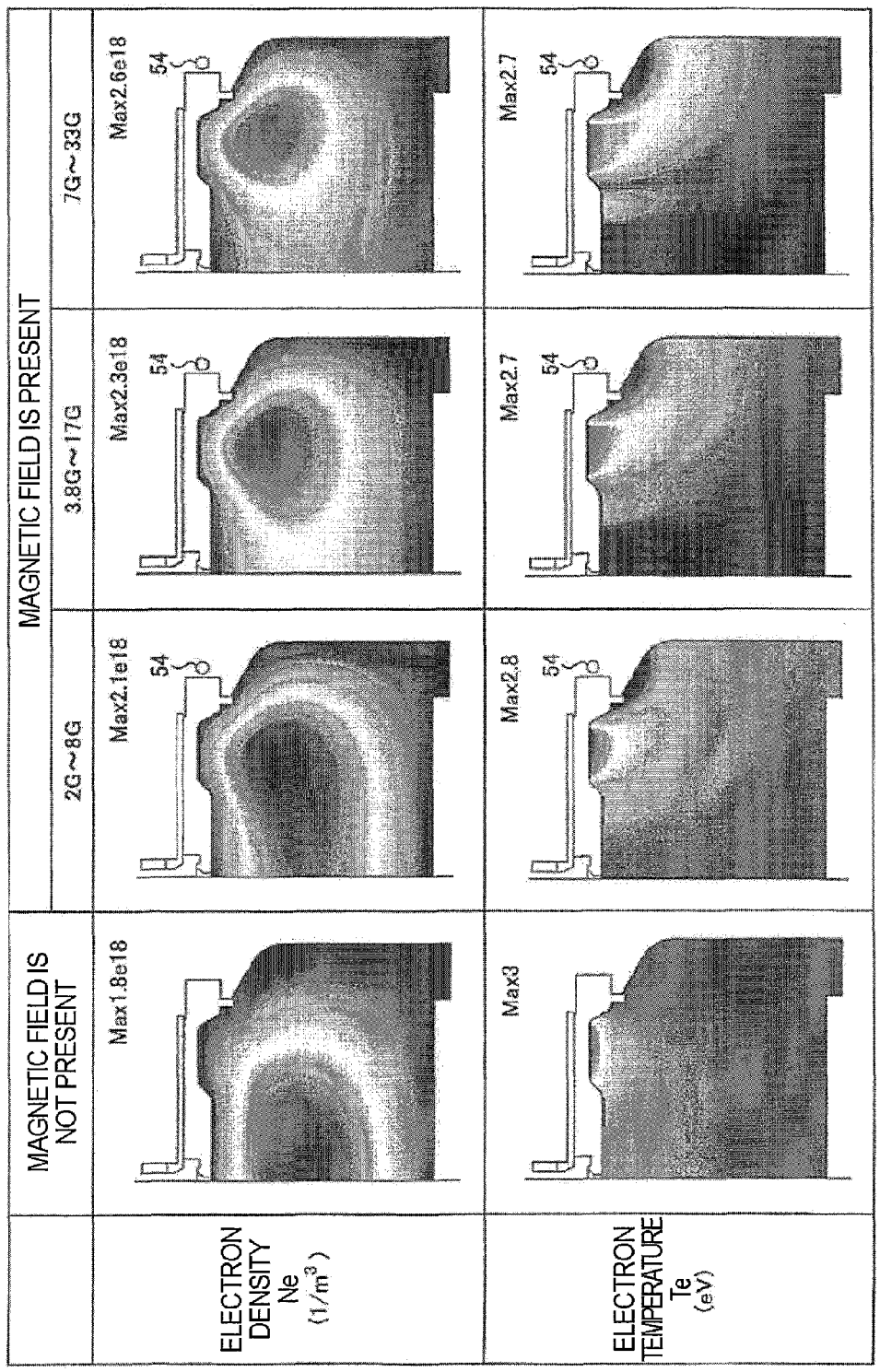
FIG. 14 is a diagram illustrating electron density and an electron temperature in the second exemplary embodiment by the contour line.

As a result of the simulation, the electron density Ne of plasma and an electron temperature Te are illustrated in FIG. 14 as the contour line. The electron density Ne ($1/m^3$) of plasma formed below the ceiling surface and the electron temperature Te (eV) are changed due to the presence of the magnetic field.

As compared with the electron density Ne in the leftmost drawing without the electromagnetic 54 (without the magnetic field), it can be seen that in the distribution of the electron density Ne in the case with the electromagnetic 54 (with the magnetic field) illustrated in the other drawings, the electrons basically move in accordance with the direction of the magnetic field illustrated in FIG. 12. That is, in the embodiment, by forming the magnetic field including the vertical magnetic field and the magnetic field outwards in the diameter direction in the chamber 1 by the electromagnetic 54, the distribution of the plasma may be controlled to move from the center of the wafer to the outer peripheral side thereof.

Further, as the magnetic flux density is increased, the number of electrons following the direction of the magnetic field is increased. Accordingly, as the magnetic flux density is increased, the effect of further moving the distribution of the plasma to the outer peripheral side is increased. The drawing on the rightmost end illustrates a simulation result in the case of having the largest magnetic flux density among the three kinds of magnetic fields which are objects of the simulation. In this case, it can be seen that the peak of the distribution of the electron density Ne of plasma moves to the outermost peripheral side of the chamber 1.

Further, in the case where the electromagnet 54 is present (the magnetic field is present), the electron temperature Te on the wafer may be decreased as compared with the case where the magnetic field is not present. That is, in the embodiment, by forming the magnetic field including the vertical magnetic field and the magnetic field outwards in the diameter direction in the chamber 1, the temperature on the wafer disposed at the center of the chamber 1 may be suppressed from being a high temperature by using that the electrons move outside the chamber 1. As a result, it is possible to prevent the wafer from being damaged during plasma processing.

FIG. 15 is a graph illustrating the electron density Ne and the electron temperature Te of plasma at a location of 5 mm or more spaced from the surface of the wafer based on the above simulation result. FIG. 15A illustrates the electron density Ne for a diameter-direction distance of the wafer. '0' of a transverse axis represents a center location of the wafer. FIG. 15B is a graph acquired by standardizing the electron density Ne of FIG. 15A, that is, the electron density Ne at the center location of the wafer as [1]. FIG. 15C illustrates the electron temperature Te for a distance in the diameter direction of the wafer. FIG. 15D is a graph acquired by standardizing the electron temperature Te of FIG. 15C, that is, the electron temperature Te at the center location of the wafer as '1'.

As a result, in the embodiment, by forming the magnetic field including the vertical magnetic field and the magnetic field outwards in the diameter direction in the chamber 1, plasma having more uniform electron density Ne in the diameter direction of the wafer may be generated by increasing the electron density Ne at the outer peripheral side of the wafer as compared with the case where the magnetic field is not present. Further, it can be seen that in the case of the high magnetic field of 7 G to 33 G, the electron density Ne at the outer peripheral side of the wafer is further increased as compared with the case of the low magnetic field of 2 G to 8 G, and as a result, the controllability of the plasma distribution is increased.

Further, in the embodiment, by forming the magnetic field including the vertical magnetic field and the magnetic field outwards in the diameter direction in the chamber 1, the electron temperature Te of the plasma is decreased as compared with the case where the magnetic field is not present. Particularly, by forming the electric field in the embodiment, the electron temperature Te at the center of the wafer is decreased as compared with the case where the magnetic field does not be present, and as a result, more uniform plasma may be generated by the electron temperature Te in the diameter direction of the wafer. As a result, the damage to the wafer during the plasma processing may be decreased.

(Plasma Control by Plasma Generating Location and Magnetic Field)

Figure 16:
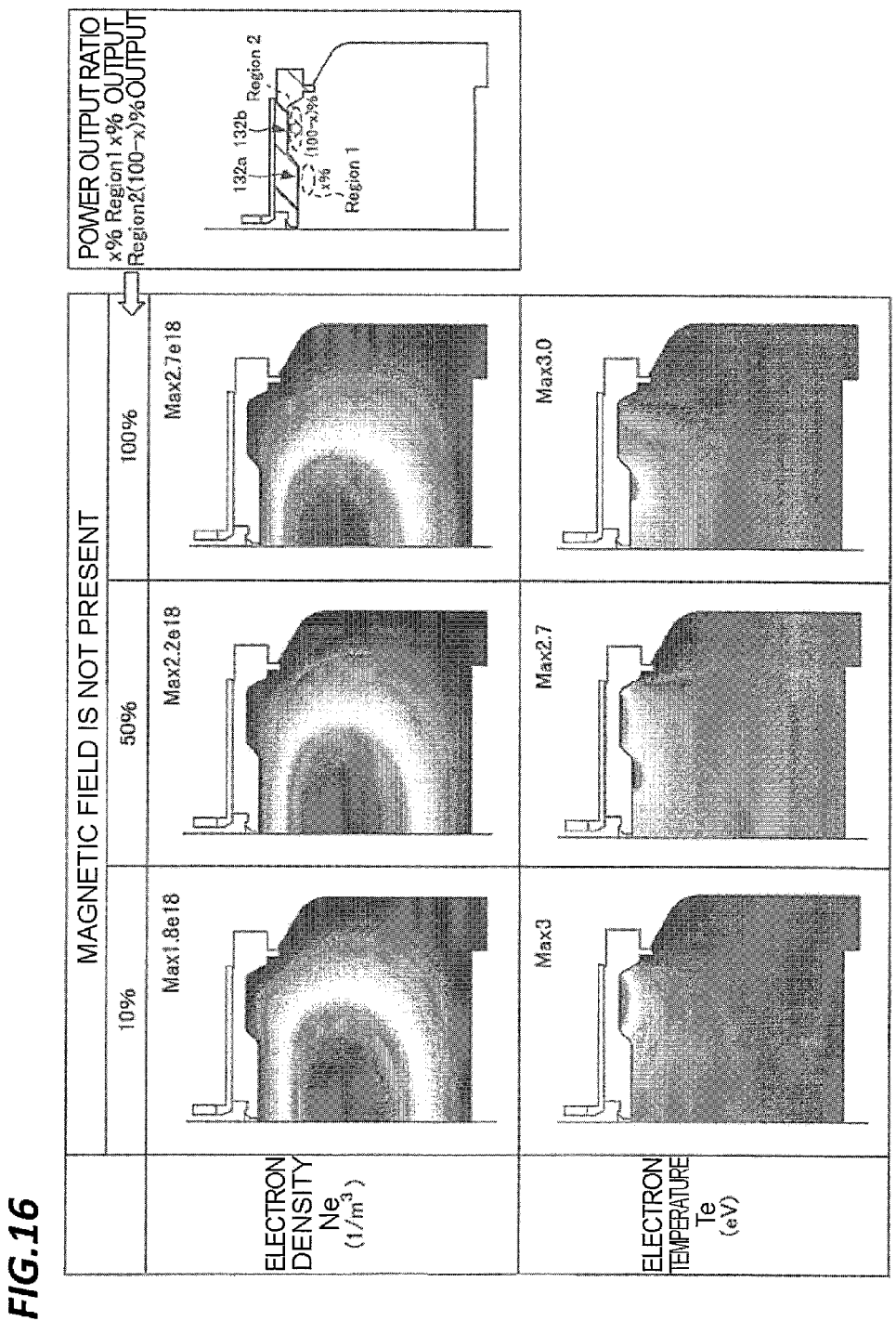
FIG. 16 is a diagram illustrating electron density and an electron temperature depending on a power output ratio from a plasma generating location in the second exemplary embodiment by the contour line (the magnetic field is not present).
Figure 17:
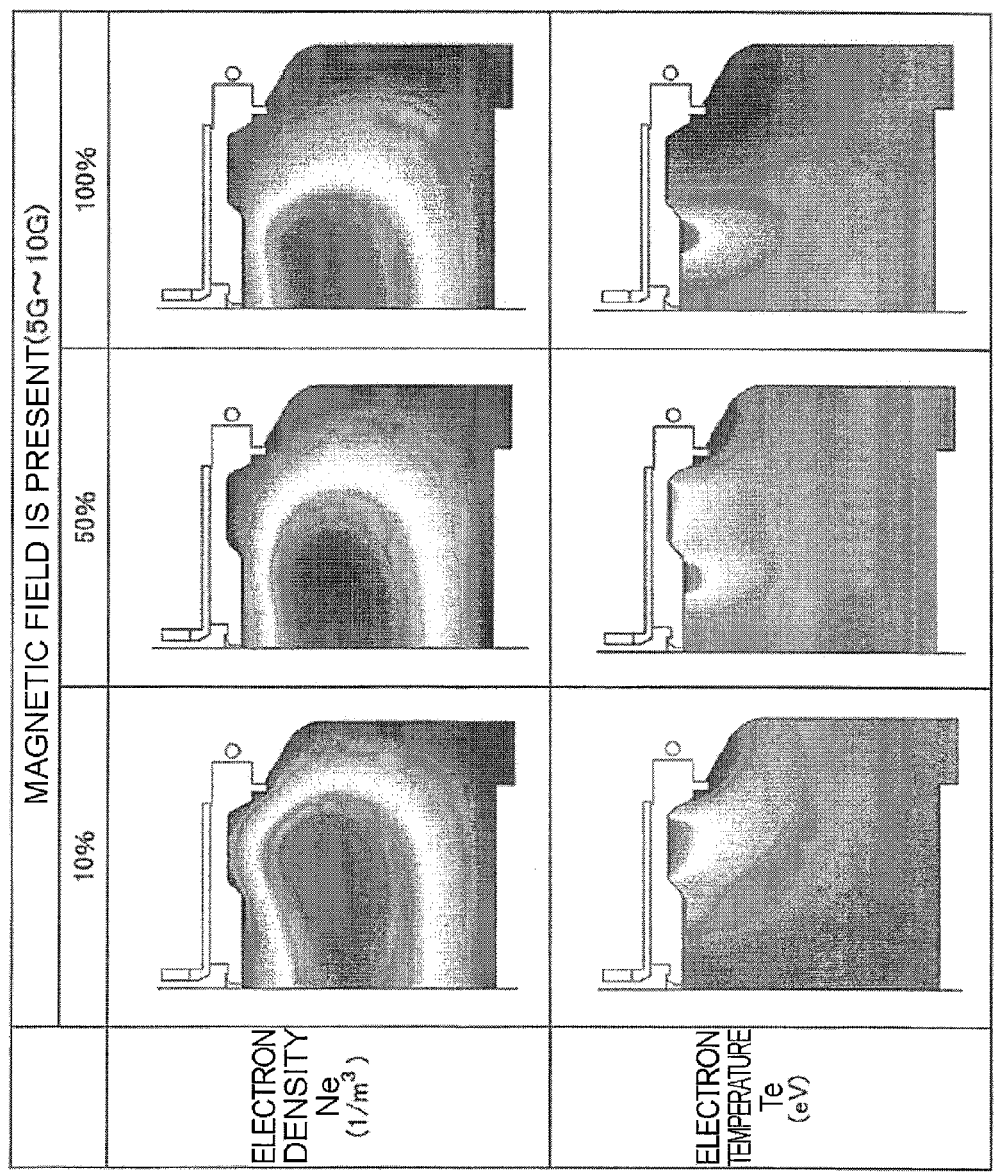
FIG. 17 is a diagram illustrating the electron density and the electron temperature depending on the power output ratio from the plasma generating location in the second exemplary embodiment by the contour line (the magnetic field is present).
Figure 18:
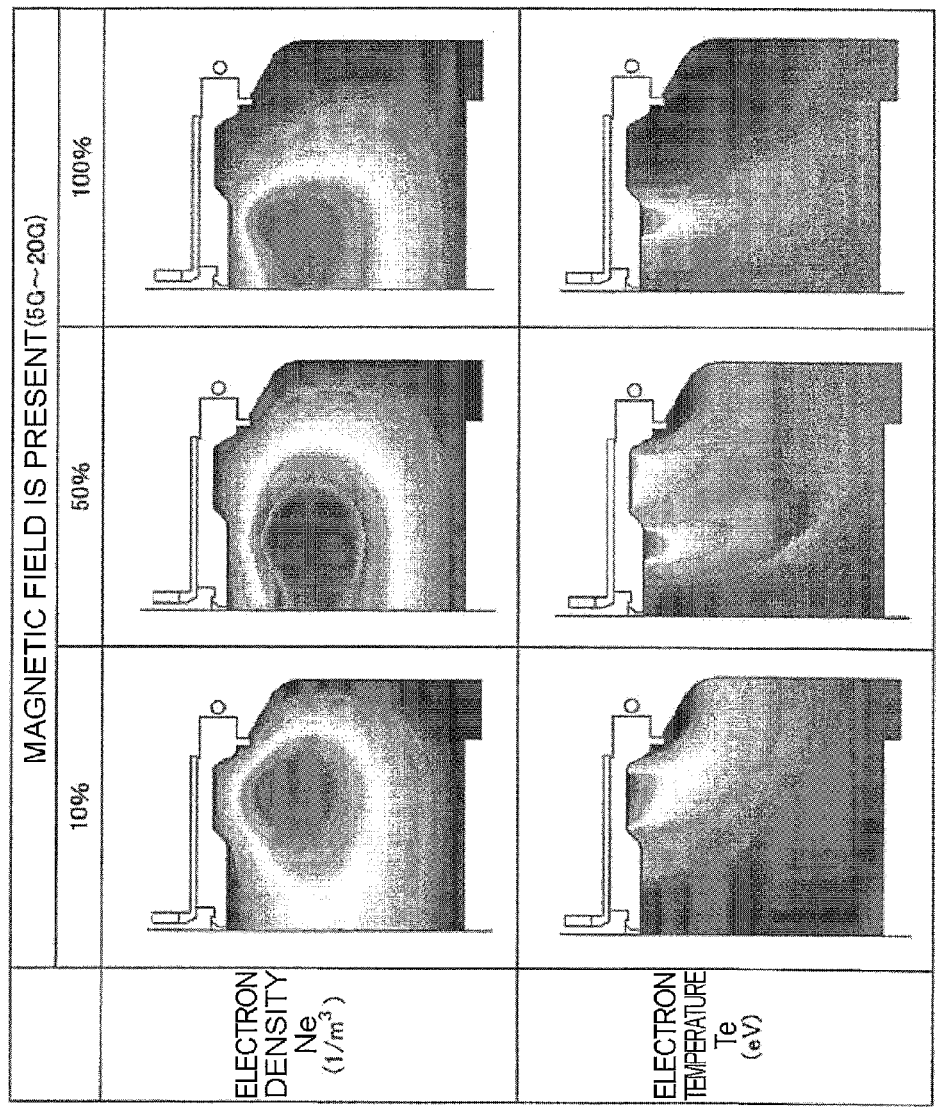
FIG. 18 is another diagram illustrating the electron density and the electron temperature depending on the power output ratio from the plasma generating location in the second exemplary embodiment by the contour line (the magnetic field is present).
Figure 20A:
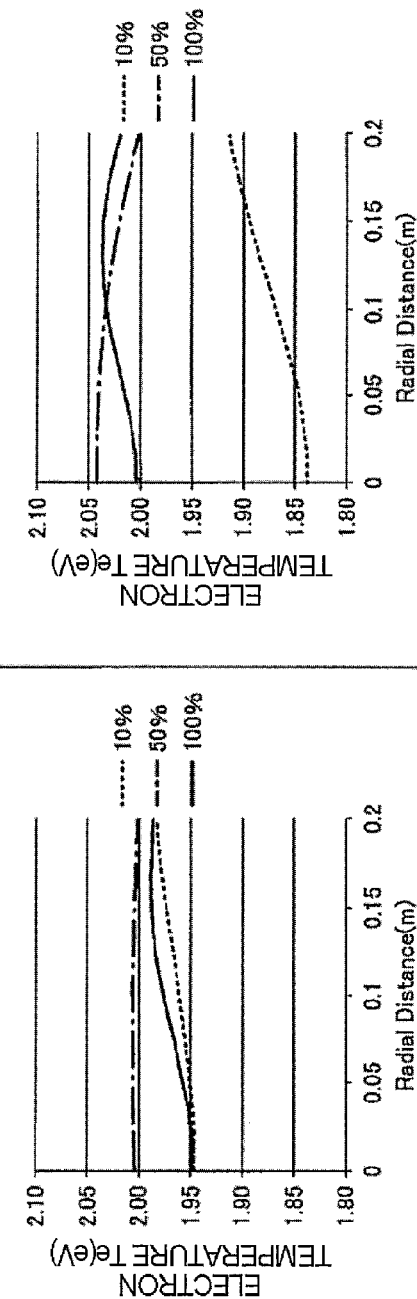
FIGS. 20A-20D are diagrams illustrating the electron temperature depending on the power output ratio from the plasma generating location in the second exemplary embodiment (the magnetic field is present).
Figure 20B:
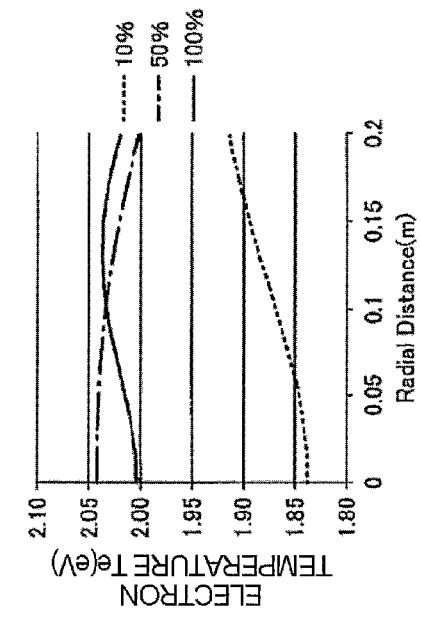
Figure 20C:
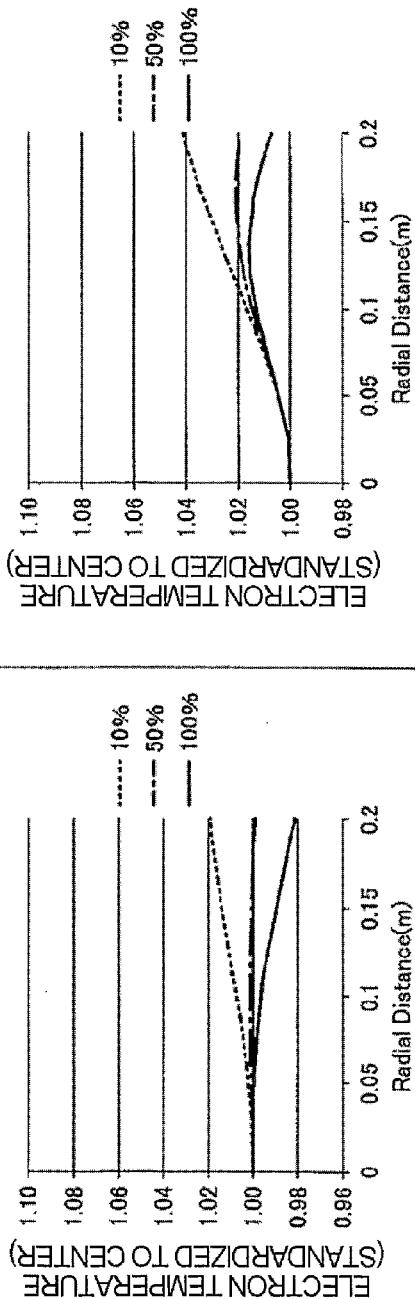
Figure 20D:
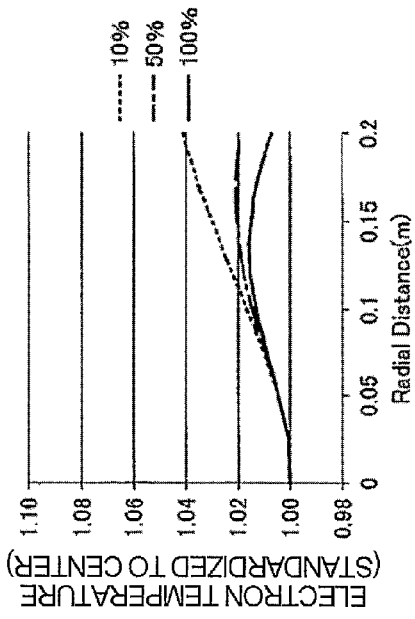

Next, a simulation how an effect on the plasma due to the magnetic field is changed by the relationship with the plasma generating location is performed. The result will be described with reference to FIGS. 16 to 18. FIGS. 16 to 18 are diagrams illustrating the electron density Ne and the electron temperature Te according to a power output ratio from the plasma generating location by a contour line in the second embodiment. FIG. 16 illustrates a case where the magnetic field is not present, and FIGS. 17 and 18 illustrate a case where the magnetic field is present. In FIG. 17, the range of the magnetic field is 5 G to 10 G ($5 \times 10^{-4}$ T to $10^{-3}$ T), and in FIG. 18, the range of the magnetic field is 5 G to 20 G ($5 \times 10^{-4}$ T to $2 \times 10^{-3}$ T).

A percentage (%) illustrated in the drawings represents a power output ratio. When the power output ratio is x %, power of x % is output from the inner plasma generating location 132a, and power of (100−x) % is output from the outer plasma generating location 132b. For example, when the power output ratio is 100%, power of 100% is output from the inner plasma generating location 132a. For example, when the power output ratio is 50%, power of 50% is output from the inner plasma generating location 132a, and power of 50% is output from the outer plasma generating location 132b. For example, when the power output ratio is 10%, power of 10% is output from the inner plasma generating location 132a, and power of 90% is output from the outer plasma generating location 132b.

When the magnetic field is not present as illustrated in FIG. 16, since the magnetic field including the vertical magnetic field and the magnetic field outwards in the diameter direction is not formed in the chamber 1, the electrons do not move outside the chamber 1, and the distribution of the electron density Ne at the center side on the wafer is dense and the outer peripheral side is sparse. In particular, as the power output ratio from the inner plasma generating location 132a is high, the distribution of the electron density Ne at the center side on the wafer is high, and as a result, diameter-direction uniformity of the wafer deteriorates.

Meanwhile, when the magnetic field is present as illustrated in FIGS. 17 and 18, since the magnetic field including the perpendicular magnetic field and the diameter-direction magnetic field is formed in the chamber 1, the electrons move outside the chamber 1 and the distribution of the electron density Ne in the diameter direction of the wafer becomes more uniform. In particular, as the power output ratio from the inner plasma generating location 132a is low, the distribution of the electron density Ne at the outer peripheral side on the wafer becomes high, and as a result, diameter-direction uniformity of the wafer increases. Meanwhile, as the power output ratio from the inner plasma generating location 132a is high, the distribution of the electron density Ne at the center side on the wafer becomes high, and as a result, the diameter-direction uniformity of plasma of the wafer decreases and the controllability of the plasma distribution deteriorates. Further, it can be seen that since the electron density Ne at the outer peripheral side on the wafer becomes higher in the case of the magnetic field having magnetic flux density (5 G to 10 G) illustrated in FIG. 17 than in the case of the magnetic having magnetic flux density (5 G to 20 G) illustrated in FIG. 18, the controllability of the plasma distribution is improved.

The electron density Ne of plasma above the surface of the wafer by 5 mm is illustrated by a graph of FIG. 19 and the electron temperature Te is illustrated by a graph of FIG. 20, based on the simulation result. FIG. 19 illustrates electron density Ne for a diameter-direction distance of the wafer. '0' of a transverse axis represents a center location of the wafer. FIGS. 19A and 19B illustrate the electron density Ne in the case of the magnetic flux density (5 G to 10 G) and FIGS. 19C and 19D illustrate the electron density Ne in the case of the magnetic flux density (5 G to 20 G). FIG. 19B is a graph acquired by standardizing the electron density Ne of FIG. 19A, that is, the electron density Ne at the center location of the wafer to '1'. FIG. 19D is a graph acquired by standardizing the electron density Ne of FIG. 19C, that is, the electron density Ne at the center location of the wafer to '1'.

FIG. 20 illustrates an electron temperature Te for the diameter-direction distance of the wafer. '0' of the transverse axis represents the center location of the wafer. FIGS. 20A and 20B illustrate the electron temperature Te in the case of the magnetic flux density (5 G to 10 G) and FIGS. 20C and 20D illustrate the electron temperature Te in the case of the magnetic flux density (5 G to 20 G). FIG. 20B is a graph acquired by standardizing the electron temperature Te of FIG. 20A, that is, the electron temperature Te at the center location of the wafer to '1'. FIG. 20D is a graph acquired by standardizing the electron temperature Te of FIG. 20C, that is, the electron temperature Te at the center location of the wafer to '1'.

According to the simulation result of the electron density Ne illustrated in FIG. 19, in the embodiment, by forming the magnetic field including the perpendicular magnetic field and the magnetic field outwards in the diameter direction in the chamber 1, the electron density Ne at the outer peripheral side of the wafer increases and plasma having a uniform distribution of the electron density in the diameter direction of the wafer may be generated. In particular, the decrease in the electron density Ne at the outer peripheral side of the wafer is less when the power output ratio is low, that is, the power output ratio from the outer plasma generating location is high as compared with when the power output ratio is high, that is, the power output ratio from the outer plasma generating location is low, and plasma having the uniform distribution of the electron density Ne in the diameter direction of the wafer may be generated. That is, it can be seen that when the plasma generating location is provided at the outer peripheral side of the wafer, the controllability of the plasma distribution is improved. Further, it can be seen that when the magnetic field having the magnetic flux density (5 G to 20 G) is generated rather than the magnetic field having the magnetic flux density (5 G to 10 G), the controllability of the plasma distribution is further improved.

Further, according to the simulation result of the electron temperature Te illustrated in FIG. 20, in the embodiment, by forming the magnetic field including the perpendicular magnetic field and the magnetic field outwards in the diameter direction in the chamber 1, the electron temperature Te decreases at the center side of the wafer and plasma having a uniform electron temperature Te in the diameter direction of the wafer may be generated. In particular, the electron temperature Te at the outer peripheral side of the wafer is further decreased when the power output ratio is low, that is, the power output ratio from the outer plasma generating location is high as compared with when the power output ratio is high, that is, the power output ratio from the outer plasma generating location is low. Further, when the magnetic field having the magnetic flux density (5 G to 20 G) is generated rather than the magnetic field having the magnetic flux density (5 G to 10 G), the electron temperature Te at the center side of the wafer may be further decreased. Therefore, damage to the wafer during the plasma processing may be further reduced.

Experiment

Control of Plasma Distribution by Magnetic Field

Figure 21A:
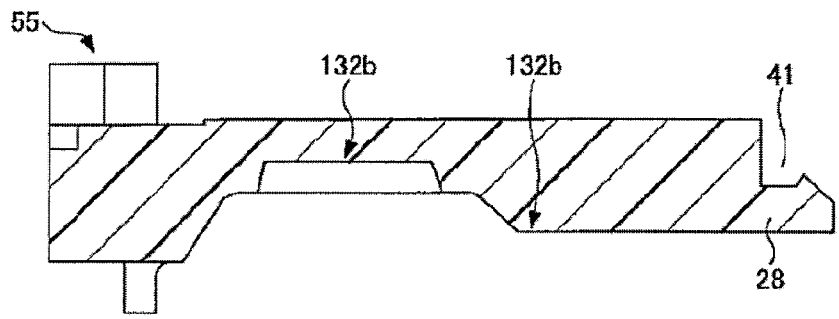
FIGS. 21A-21C are diagrams illustrating a layout of magnets and a magnetic field generation example in the second exemplary embodiment.
Figure 21B:
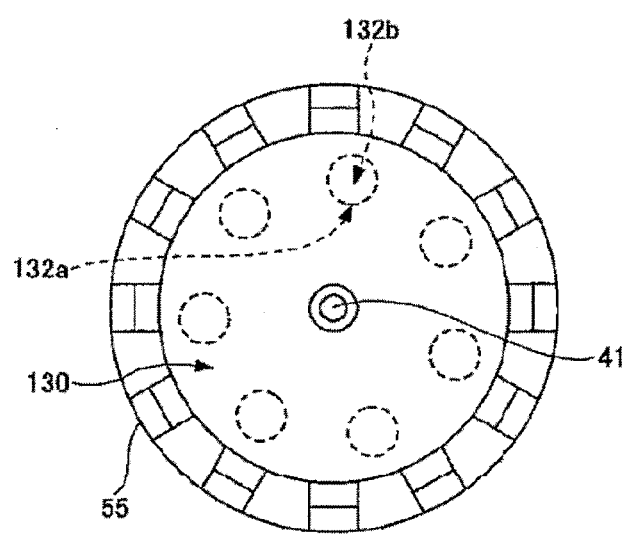

Next, an experiment regarding how a state of a plasma generating area is changed by the presence or not of the electromagnet 54 and the magnitude of a magnetic flux density was performed. In this experiment, as illustrated in FIGS. 21A and 21B, 12 permanent magnets 55 were placed around an outer peripheral end of the top of a ceiling of the radial line slot antenna apparatus 100 at a regular interval. As such, the permanent magnets 55 are provided at the outer peripheral end side of the antenna unit 130 outside the chamber 1 and have the S pole and the N pole, respectively, to form a magnetic field including a vertical magnetic field, which is illustrated in FIG. 12 and a magnetic field outwards in the diameter direction in the chamber 1.

Figure 21C:
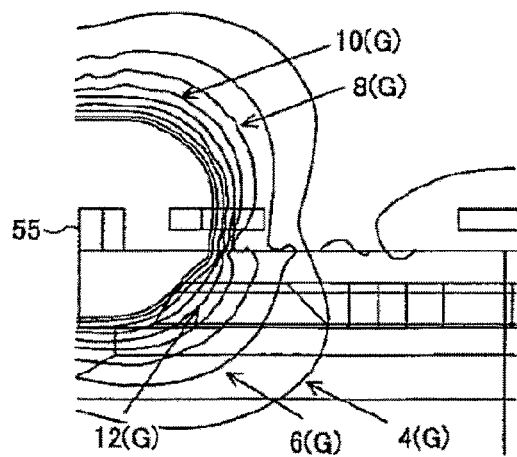

In the experiment, one permanent magnet 55 has a size of 20 mm×20 mm, but the size or shape of the permanent magnet is not limited thereto and a magnetic field of approximately 1 G to 50 G may be applied to the lower side of the antenna unit 130 in the chamber 1. FIG. 21C illustrates a state in which the magnetic field of 4 G to 12 G ($4\times10^{-4}$ T to $1.2\times10^{-3}$ T) is applied around the electromagnet 54.

As illustrated in FIG. 21, in the radial line slot antenna apparatus 100 according to the second embodiment in which the experiment is performed, seven concave portions forming the plasma generating location 132b are formed at the outer peripheral side of the antenna unit 130 at a regular interval. However, in the case of the locations or the number of the concave portions, when the concave portions are formed at the location of 50% or more spaced from the center location of the chamber 1, the number of the concave portions is not limited to 7.

Figure 22:
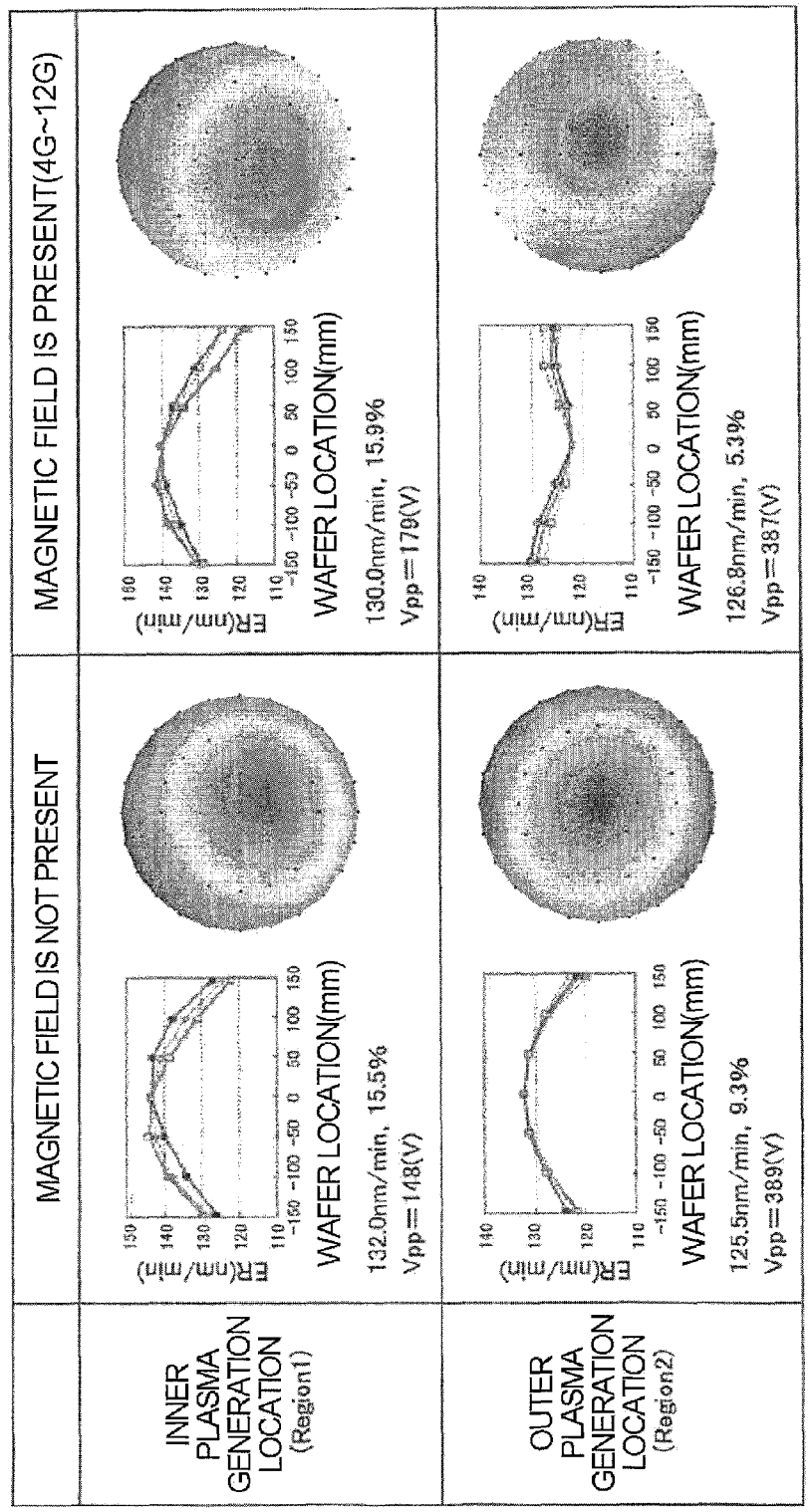
FIG. 22 is a diagram illustrating a relationship between a plasma generating location and an etching rate in a process using the magnets of FIGS. 21A-21C.

A result of experimenting on the controllability of the plasma distribution is illustrated in FIG. 22 by using the radial line slot antenna apparatus 100 having such a configuration. A process condition in this case is as follows.
<Process Condition>
Pressure: 20 mT (2.67 Pa)
Power of microwave: 1,700 W
Frequency and power of high-frequency power (applied from high-frequency power supply (not illustrated) connected to susceptor: 13.56 MHz/200 W
Gas type and gas flow rate: Ar/$CF_4$=500/100 (sccm)
Ratio of gas introduced from center/edge: 95(%)/(5%)
Temperature of susceptor (electrostatic chuck): 30° C.
Plasma radiation time: 60 sec.
<Experimental Result>
An upper end of FIG. 22 illustrates a result of comparing diameter-direction etching rates of the wafer at the inner plasma generating location 132a (plasma generating area 1) in a case where the magnetic field is not present and in a case where the magnetic field is present (4 G to 12 G) with each other. A lower end of FIG. 22 illustrates a result of comparing diameter-direction etching rates of the wafer at the outer plasma generating location 132b (plasma generating area 2) in the case where the magnetic field is not present and in the case where the magnetic field is present (4 G to 12 G) with each other.

From the above, according to the radial line slot antenna apparatus 100 according to the embodiment, the plasma distribution in the diameter direction of the chamber may be controlled without increasing the electron temperature Te of plasma on the wafer. Further, a magnetic field having comparatively low magnetic flux density of approximately 1 G to 50 G is applied to control the diameter-direction plasma distribution of the chamber. Accordingly, by optimally setting a gap from the wafer to the ceiling, the magnetic field does not reach the wafer, thereby preventing the magnetic field from influencing the plasma processing of the wafer.

(Dependence of Control of Plasma Distribution on Pressure)

Figure 23:
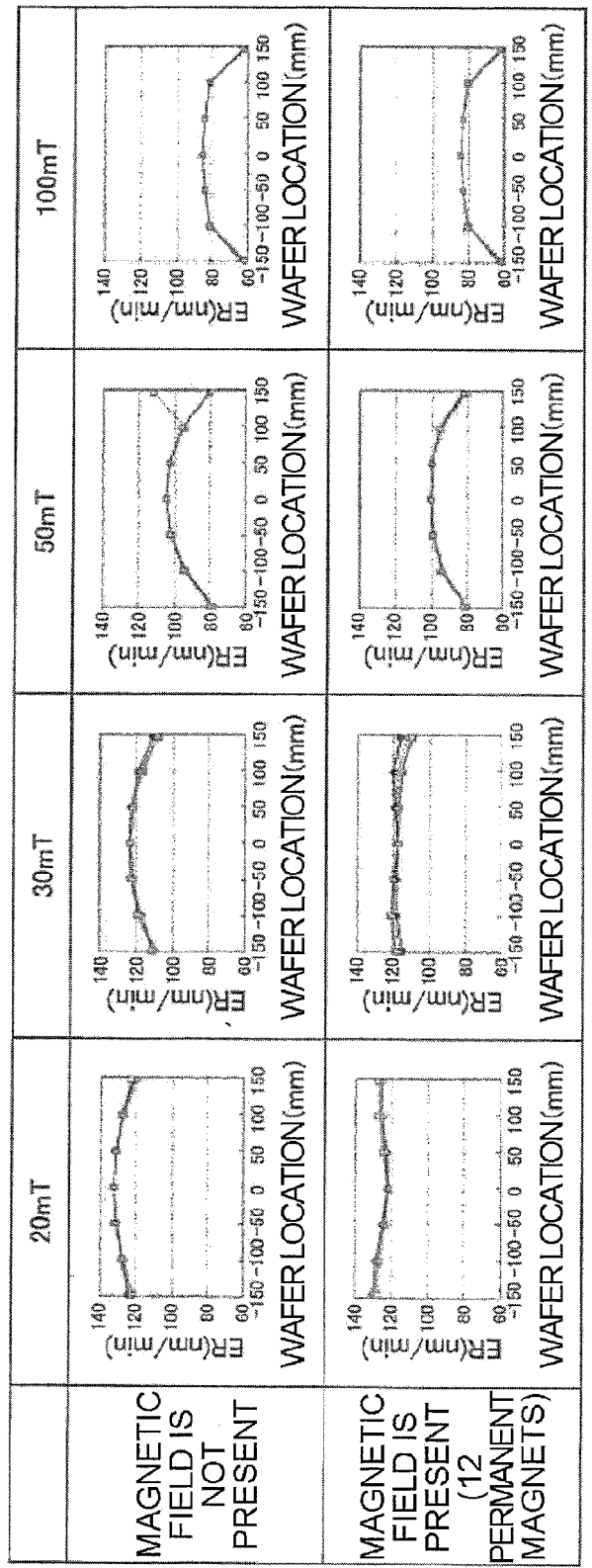
FIG. 23 is a diagram illustrating pressure dependence of the etching rate in the process using the magnets of FIGS. 21A-21C.

Finally, an experimental result for the dependence of the control of the plasma distribution on pressure will be described with reference to FIG. 23. A process condition in this case is the same as the process condition used in the experiment of FIG. 22, and only a pressure value is changed to 20 mT (2.67 Pa), 30 mT (4.00 Pa), 50 mT (6.66 Pa), and 100 mT (133 Pa).
<Experimental Result>
An upper end of FIG. 23 illustrates the diameter-direction etching rate of the wafer for each pressure in the case where the magnetic is not present and a lower end of FIG. 23 illustrates the diameter-direction etching rate of the wafer for each pressure in the case where the magnetic field is present.

From the result, it can be seen that at the pressure in the chamber which is equal to or less than 50 mT (6.66 Pa), in the case where the magnetic is applied, the uniformity of the diameter-direction etching rate of the chamber is increased as compared with the case where the magnetic field is not present. In particular, the uniformity of the etching rate at a low-pressure side at which the pressure in the chamber is 20 mT or 30 mT is high. However, it is considered that the uniformity of the etching rate may be enhanced by appropriating the size or the layout of the magnetic field even when the pressure in the chamber is approximately 100 mT.

According to the radial line slot antenna apparatus 100 according to the second embodiment, which has been described above, the vertical magnetic field and the transverse magnetic field outwards in the diameter direction of the chamber 1 are applied to the plasma generating location and an area therearound in the chamber 1 to increase the electron density Ne of plasma at the outer peripheral side on the wafer. Therefore, the uniformity of plasma in the diameter direction of the wafer may be increased. In particular, in the second embodiment, a magnetic field including a horizontal component toward the outside the chamber 1 in addition to a vertical component is applied to lower the electron temperature Te on the wafer as compared with the case of the first embodiment in which the vertical magnetic field is applied. Further, in the case of the second embodiment, the plasma distribution may be controlled even when the gap is wide as compared with the case of the first embodiment. As such, in the case of the second embodiment, dependence of the gap is resolved to control the plasma distribution with the wide gap.

Although the plasma processing apparatus and the plasma processing method have been described by the above embodiments, the present invention is not limited to the embodiments but various changes and modifications can be made within the scope of the present invention. Further, contents disclosed in the first and second embodiments may be combined within an uncontradictory scope.

For example, as a unit for generating plasma according to the present invention, a unit for generating microwave excitation surface wave plasma including slot plane antenna (SPA) plasma in addition to radial line slot antenna microwave plasma, an inductively coupled plasma (ICP) generating unit, a remote plasma generating unit using the generating unit and the like may be used.

Further, in the plasma processing apparatus according to the present invention, the slot may be provided at the location of at least 50% or more spaced from the center location of the chamber with respect to the radius of the chamber. That is, the slot may be provided at only the location of 50% or more spaced from the center location of the chamber with respect to the radius of the chamber or both the location of 50% or less and the location of 50% or more spaced from the center location of the chamber with respect to the radius of the chamber.

Further, in the plasma processing apparatus according to the present invention, the slot may be placed further outside than the peripheral side of the object to be processed that is placed in the susceptor or placed further outside than the inside from the peripheral side of the object to be processed that is placed in the susceptor by 10%.

Further, in the present invention, the object to be processed that is subjected to the plasma processing is not limited to a semiconductor wafer and may be, for example, a large substrate for a flat panel display, an EL element, or a substrate for a solar battery.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A microwave plasma processing apparatus comprising:
   a processing chamber including a susceptor configured to dispose a substrate to be processed;
   an oscillator configured to output high-frequency power;
   a power supply unit including a transmission plate and configured to supply the high-frequency power to a specific plasma generating location in the processing chamber, the transmission plate including a concave portion of which a center portion is formed at an outer peripheral side of a bottom surface of the transmission plate of the power supply unit;
   a magnetic field forming unit provided outside the processing chamber near an outer peripheral portion or a lateral portion of the transmission plate and configured to form a magnetic field in a perpendicular direction with respect to the susceptor at least at the specific plasma generating location including an area near the concave portion of the transmission plate of the power supply unit; and
   a control unit programmed to control a pressure in the processing chamber to be 50 mTorr (6.66 Pa) or less and an intensity of the magnetic field formed in the perpendicular direction with respect to the susceptor by the magnetic field forming unit to be 1 G to 50 G ($10^{-4}$ T to $50^{-3}$ T) such that a relationship between an electron collision frequency fe of plasma generated in the processing chamber and a cyclotron frequency fc is fc>fe in order to move an area where an electron density of the plasma is high from a center side to an outer peripheral side in the processing chamber below the concave portion,
   wherein the power supply unit further includes a radial line slot antenna unit disposed above the transmission plate and a slow-wave member disposed on a top of the radial line slot antenna unit,
   wherein the concave portion is located at a position that is 50% or more spaced from a center of the processing chamber.

2. The plasma processing apparatus of claim 1, wherein the magnetic field forming unit is provided on an outer peripheral portion or a lateral portion of the power supply unit provided at a ceiling of the processing chamber.

3. The plasma processing apparatus of claim 1, wherein the specific plasma generating location is provided at a location of 50% or more spaced from a center location of the processing chamber with respect to a diameter of the processing chamber in the power supply unit provided at a ceiling of the processing chamber.

4. The plasma processing apparatus of claim 3, wherein the specific plasma generating location is formed outside the peripheral portion of an object to be processed that is placed in the processing chamber.

5. The plasma processing apparatus of claim 1, wherein a gap between a ceiling of the processing chamber and the placed object to be processed is set such that the magnetic field formed by the magnetic field forming unit does not reach the placed object to be processed.

6. The plasma processing apparatus of claim 1, wherein the gas introduced into the processing chamber is argon gas, and
   the control unit controls an electron temperature of plasma generated in the processing chamber to be 0.5 eV to 5 eV.

7. The plasma processing apparatus of claim 1, wherein the control unit switches ON and OFF of application of the magnetic field in time division control, and pulse-controls the magnetic field.

8. A microwave plasma processing apparatus, comprising:
   a processing chamber including a susceptor for an object to be processed and configured to be supplied with gas to generate plasma in the processing chamber;
   a magnetic field forming unit provided outside the processing chamber and configured to form a magnetic field in a direction perpendicular to the object to be processed that is placed in the processing chamber;
   an oscillator configured to output high-frequency power;
   a radial line slot antenna unit including a transmission plate provided in the processing chamber and configured to supply the high-frequency power output by the oscillator to the processing chamber, the transmission plate of the antenna unit including a concave portion of which a center portion is formed at an outer peripheral side of a bottom surface of the transmission plate such that the magnetic field forming unit also forms the magnetic field at an area near the concave portion of the transmission plate of the antenna unit; and
   a control unit programmed to control a pressure in the processing chamber to be 20 mT to 200 mT (2.67 Pa to 26.7 Pa) and an intensity of the magnetic field formed in a direction perpendicular to the susceptor by the magnetic field forming unit to be 1 G to 50 G ($10^{-4}$ T to $50^{-3}$ T) such that a relationship between an electron collision frequency fe of plasma generated in the processing chamber and a cyclotron frequency fc is fc>fe in order to move an area where an electron density of the plasma is high from a center side to an outer peripheral side in the processing chamber below the concave portion, wherein the radial line slot antenna unit further includes a slow-wave member disposed on a top of the antenna unit and the radial line slot antenna is disposed above the transmission plate, wherein the concave portion is located at a position that is 50% or more spaced from a center of the processing chamber.

9. A microwave plasma processing method, comprising:

providing a power supply unit including a radial line slot antenna, a slow-wave member and a transmission plate, the radial line slot antenna being disposed above the transmission plate and the slow-wave member being disposed on the radial line slot antenna, and the transmission plate including a concave portion of which a center portion is formed at an outer peripheral side of a bottom surface of the transmission plate;

supplying high-frequency power generated from the power supply unit to a specific plasma generating location in a processing chamber where a substrate to be processed is disposed;

forming a magnetic field in a perpendicular direction with respect to the substrate disposed on a susceptor at least at the specific plasma generating location including an area near the concave portion of the transmission plate of the power supply unit in the processing chamber by a magnet provided outside the processing chamber; and controlling a pressure in the processing chamber to be 50 mTorr (6.66 Pa) or less and an intensity of the magnetic field formed in a perpendicular direction with respect to the substrate disposed on a susceptor to be 1 G to 50 G ($10^{-4}$ T to $50^{-3}$ T) such that a relationship between an electron collision frequency fe of plasma generated in the processing chamber and a cyclotron frequency fc is fc>fe in order to move an area where an electron density of the plasma is high from a center side to an outer peripheral side in the processing chamber below the concave portion, wherein the concave portion is located at a position that is 50% or more spaced from a center of the processing chamber.

10. The plasma processing method of claim 9, wherein the controlling of the magnetic field includes switching ON and OFF of application of the magnetic field in time division and pulse-controlling the magnetic field.

11. The plasma processing method of claim 9, wherein the specific plasma generating location is around just below a transmission plate serving as a dielectric window passing the high-frequency power and a level of electron density of plasma just below the transmission plate is higher than a level of a cutoff density of the high-frequency power.

* * * * *